United States Patent
Noguchi et al.

[11] Patent Number: 6,016,187
[45] Date of Patent: *Jan. 18, 2000

[54] EXPOSURE APPARATUS AND METHOD

[75] Inventors: Minori Noguchi; Yukio Kenbo, both of Yokohama; Yoshitada Oshida, Fujisawa; Masataka Shiba; Yasuhiro Yoshitaka, both of Yokohama; Makoto Murayama, Fujisawa, all of Japan

[73] Assignee: Hitachi, Ltd., Tokyo, Japan

[*] Notice: This patent is subject to a terminal disclaimer.

[21] Appl. No.: 09/003,141

[22] Filed: Jan. 6, 1998

[30] Foreign Application Priority Data

| Mar. 5, 1991 | [JP] | Japan | 3-038387 |
| Mar. 25, 1991 | [JP] | Japan | 3-059944 |
| Oct. 10, 1991 | [JP] | Japan | 3-258868 |
| Nov. 29, 1991 | [JP] | Japan | 3-315976 |

[51] Int. Cl.[7] ............................................... G03B 27/42
[52] U.S. Cl. ....................................... 355/53; 355/71
[58] Field of Search .............................. 355/53, 55, 67, 355/71

[56] References Cited

U.S. PATENT DOCUMENTS

| 3,947,112 | 3/1976 | Hahn et al. . |
| 4,666,294 | 5/1987 | Imamura et al. . |
| 4,744,660 | 5/1988 | Noguchi et al. . |
| 4,788,600 | 11/1988 | Marsiglio et al. . |
| 4,905,041 | 2/1990 | Aketagawa . |
| 4,947,413 | 8/1990 | Jewell et al. . |
| 5,048,967 | 9/1991 | Suzuki et al. . |
| 5,062,705 | 11/1991 | Sato et al. . |
| 5,121,160 | 6/1992 | Sano et al. . |
| 5,305,054 | 4/1994 | Suzuki et al. ........................... 355/53 |
| 5,767,949 | 6/1998 | Noguchi et al. ......................... 355/67 |

FOREIGN PATENT DOCUMENTS

| 352975 | 1/1990 | European Pat. Off. . |
| 8 123 725 | of 0000 | France . |
| 61-91662 | 5/1986 | Japan . |
| 6-82598 | 10/1994 | Japan . |
| 9 203 842 | 8/1990 | WIPO . |

Primary Examiner—Richard Moses
Attorney, Agent, or Firm—Antonelli, Terry, Stout & Kraus, LLP

[57] ABSTRACT

An exposure apparatus and method wherein a mask is illuminated with light and light one of transmitted through and reflected from the illuminated mask is imaged onto a substrate. At least during imaging transmission of light one of transmitted and reflected from the illuminated mask is partially inhibited. More particularly, a spatial filter is utilized for inhibiting at least a portion of O-order diffraction light.

17 Claims, 26 Drawing Sheets

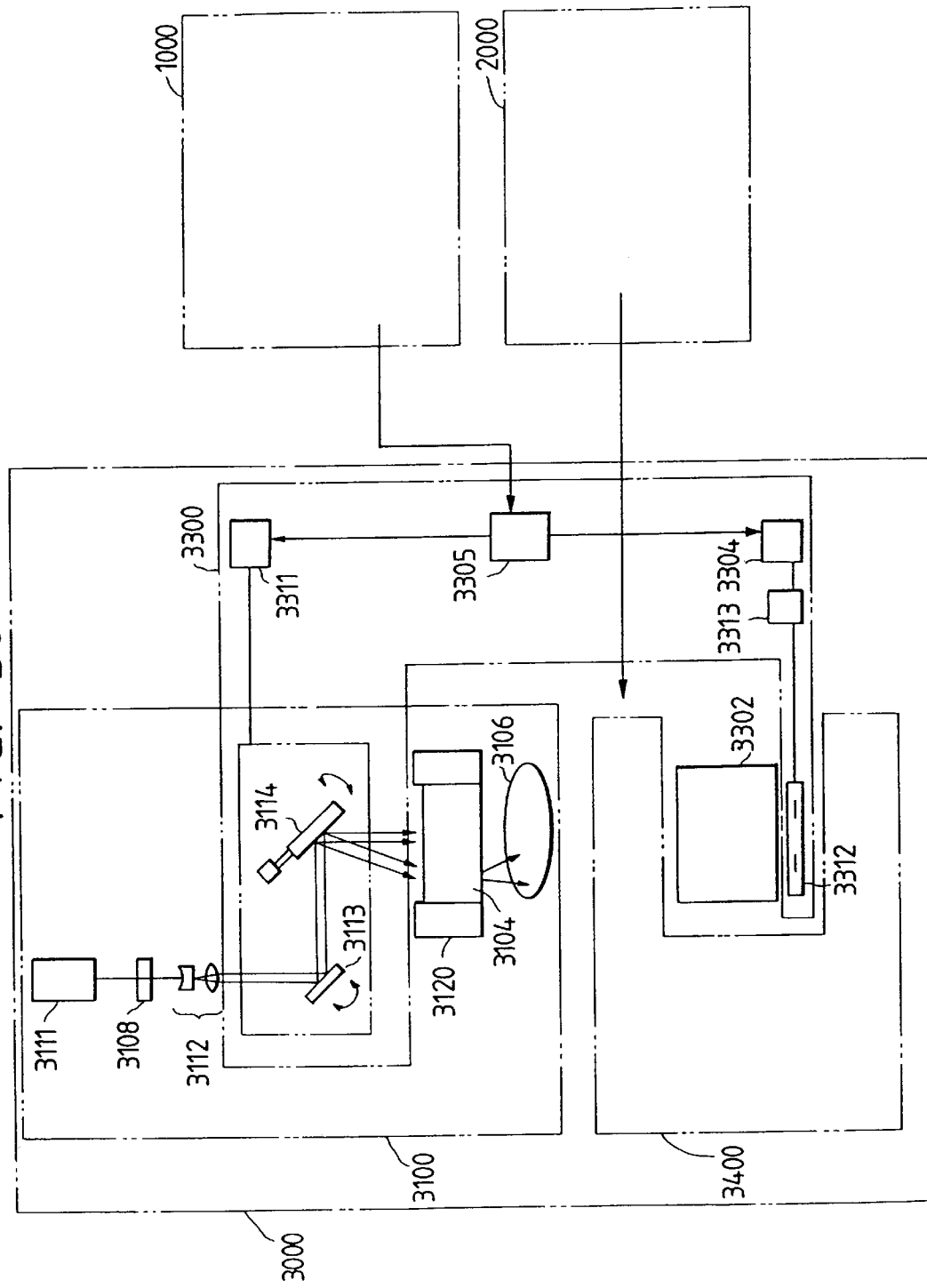

EXPOSURE APPARATUS AND METHOD

CROSS REFERENCE TO RELATED APPLICATION

This is a continuation of U.S. application Ser. No. 08/727,762, filed Oct. 8, 1996, which is a continuation of U.S. application Ser. No. 08/501,178, filed Jul. 11, 1995, now abandoned, which is a continuation of U.S. application Ser. No. 08/235,654, filed Apr. 29, 1994, now U.S. Pat. No. 5,526,094, issued Jun. 11, 1996, which is a continuation of U.S. application Ser. No. 07/846,158, filed Mar. 5, 1992, now U.S. Pat. No. 5,329,333, issued Jul. 12, 1994, the subject matter of which is incorporated by reference herein.

BACKGROUND OF THE INVENTION

The present invention relates to an exposure method and apparatus therefor, an exposure system and a mask circuit pattern inspection system, which eliminate an influence of interference light generated in an extremely fine circuit pattern formed on a mask, so that an image is formed with a high resolving power on a substrate through a projection lens and exposed and, further, wherein the light source is an excimer laser light source.

In the manufacture of an LSI, a circuit pattern on a mask is exposed and transferred onto a wafer to form a fine circuit pattern on the wafer. However, to cope with the need of high integration of LSI, the circuit pattern transferred onto the wafer tends to be an extremely fine pattern, which constitutes a resolution limit of an imaging optical system.

In view of the foregoing, various techniques have been developed in order to transfer an extremely fine circuit pattern.

For example, there is a method for exposure using X-rays such as SOR (Synchrotron Organized Resonance) light. There is a further method which uses an EB (Electron Beam) exposure machine. Furthermore, there is another method using an excimer laser disclosed in "Excimer Laser Stepper for Sub-half Micron Lithography, Akikazu Tanimoto, SPIE, Vol. 1088 Optical Laser Microlithography 2 (1989)" or Japanese Patent Laid-Open No. 57(1982)-198631.

A theoretical analysis of partial coherent imaging is introduced in "Stepper's Optics (1), (2), (3) and (4)" (Optical Technical Contact: Vol. 27, No. 12, pp. 762–771, Vol. 28, No. 1, pp. 59–67, Col. 28, No. 2, pp. 108–119, Vol. 28, No. 3, pp. 165–175).

Also, Japanese Patent Unexamined Publication No. 3-27516 describes an example in which a spatial filter is used to improve a resolving power.

Further, a phase shifter method for modifying a mask to improve a resolving power is known from Japanese Patent Publication No. 62(1987)-50811. According to this phase shifter method, light from a neighboring pattern is made to interfere, thereby enhancing the resolving power, which is realized by providing a film (a phase shifter) with phases alternately deviated through $\pi$ so that phases of adjacent patterns are inverted. However, the prior art known from the aforementioned Patent Publication No. 62(1987)-50811 has a problem in that an arrangement of the phase shifter is difficult, and the manufacture of a mask provided with the phase shifter is difficult.

SUMMARY OF THE INVENTION

An object of the present invention is to provide an exposure method and an apparatus therefor so that an extremely fine white and black circuit pattern formed on a mask can be transferred onto a substrate with a resolving power equal to or higher than a phase shifter, while solving the aforementioned problem noted with respect to the prior art.

It is a further object of the present invention to provide an exposure method and system, and particularly an excimer exposure method and system, in which data of a transferred pattern on a substrate actually transferred by an exposure apparatus can be confirmed through simulation by arithmetic processing.

It is another object of the present invention to provide a mask circuit pattern inspection system in which even in the case where an extremely fine circuit pattern formed on a mask is different from a pattern transferred onto a substrate, the extremely fine circuit pattern formed on the mask can be inspected with high accuracy.

The aforesaid problem can be solved by the present invention which provides an exposure apparatus or exposure method comprising an illuminating arrangement, such as an excimer laser light source, having coherent property to a certain degree, an imager for imaging light in which a mask (including a reticle) illuminated by the illuminating arrangement is imaged onto a wafer, and a shield for shielding at least a part of the 0-order diffraction light out of light which transmits through or reflects from the mask.

The present invention further provides an excimer exposure apparatus wherein a spatial filter shields an area corresponding to the NA of the illuminating arrangement.

Furthermore, the present invention provides an excimer exposure apparatus wherein the illuminating arrangement comprises an integrator and a spatial filter.

Moreover, the present invention provides an excimer exposure apparatus wherein the mask has a circuit pattern formed to have a line width which is substantially ½ of an imaging resolving power.

The present invention also provides a projection type exposure apparatus and method comprising an illuminating arrangement for substantially uniformly applying ring-like diffused illumination formed from a number of imaginary point sources to a mask in an exposure area, and a reduction projection lens having an optical eye which shields at least a part of the 0-order diffraction light or low-order diffraction light out of light which transmits through the mask substantially uniformly diffused and illuminated by the illuminating arrangement and imaging a circuit pattern formed on the mask onto a substrate in the exposure area, wherein the circuit pattern formed on the mask is sequentially exposed on the substrate by step-and-repeat processing.

The present invention further provides an excimer exposure method which includes the steps of illuminating a mask formed with a circuit pattern, shielding at least a part of the 0-order diffraction light out of light which transmits through or reflects from the circuit pattern of the illuminated mask, imaging the light by an imager, and transferring the imaged light onto a substrate.

Furthermore, the present invention provides an excimer exposure method wherein the minimum line width of the circuit pattern on the mask is formed by being suited to an imaging resolving power of the imager.

Moreover, the present invention provides an excimer exposure method wherein the mask has a circuit pattern formed to have a line width which is substantially ½ of the imaging resolving power.

The present invention further provides an excimer exposure method wherein the circuit pattern on the mask is formed to have a line width which is substantially ½ of the imaging resolving power, and in a wide circuit pattern when transferred onto a substrate, a transmission portion on the mask is formed of a line and space having a pitch of substantially ½ to ⅓ of the imaging resolving power or a lattice pattern.

The present invention further provides an excimer exposure method which includes the steps of dividing a circuit pattern formed on a mask into a fine pattern portion and a large pattern portion, imaging them by an imager and transferring the same onto a substrate.

The present invention also provides an excimer exposure system including a mask data converter for converting and producing data of a mask from data, and a calculator for applying arithmetic processing based on a transmission function substantially equivalent to an imager for transferring a circuit pattern formed on the mask using excimer laser light with respect to mask data obtained from the mask data converter to calculate data of the transferred pattern onto a substrate.

The present invention additionally provides a mask circuit pattern inspection system including a mask data converter for converting and producing data of a mask from wiring data, a calculator for applying arithmetic processing based on a transmission function substantially equivalent to an imager for transferring a circuit pattern formed on the mask using excimer laser light with respect to mask data obtained from the mask data converter to calculate data of a transferred pattern on a wafer, an inspection device including an illuminating arrangement for illuminating a mask with the excimer light, an imager for imaging light which transmits through or reflects from a mask illuminated by the illuminating arrangement to a detection position, the imager having a transmission function substantially equivalent to that of the first-mentioned imager, and a light receiver for receiving an imaging circuit pattern imaged on the detection position to obtain an image signal, and a comparator for comparing an image signal obtained from the light receiver of the inspection device with data of a transferred pattern on a wafer calculated by the calculator.

In an exposure apparatus using excimer laser light, for example, the contrast of a circuit pattern transferred onto a substrate is degraded because diffraction light cannot be sufficiently taken into an opening (pupil) of the imager. Light is diffracted according to the using waveform and the dimension of the circuit pattern from the circuit pattern on the mask. At that time, in the case where a circuit pattern is extremely fine, a diffraction angle becomes large, and intensity of diffracted light also increases. As the result, light does not enter an opening of the imager (projection lens) used for transfer, which constitutes the cause for degrading the resolving power.

In order to minimize the loss of the diffracted light, it is contemplated that the wavelength is shortened to reduce diffraction components as in an excimer laser stepper or the NA of the imager (projection lens) is increased so as to receive diffraction light as much as possible.

On the other hand, according to the present invention, with a view to a phenomenon in which less components of diffraction light from a circuit pattern on a mask is received into imager (projection lens) whereas all components (O-order diffraction light) not diffracted from the circuit pattern on the mask are received therein, the O-order diffraction light alone in a large amount of light necessary for imaging is received into the imager (projection lens), and less diffraction light components is relatively received into the imager (projection lens). From a viewpoint of this, at least a part of the O-order diffraction light is shielded thereby to relatively improve a balance in quantity of light between the diffraction light emitted out of the imager (projection lens) and the O-order diffraction light and to improve the contrast of an extremely fine circuit pattern formed on the mask to be imaged and transferred onto the substrate through the imager (projection lens), thus realizing the exposure with high resolving power.

Particularly, in the present invention, there are provided an illuminating arrangement for substantially uniformly applying a ring-like diffused illumination formed from a number of imaginary point sources to a mask in an exposure area, and a reduction projection lens having an optical aye which shields at least a part of the O-order diffraction light or low-order diffraction light out of light which transmits through the mask substantially uniformly diffused and illuminated by the illuminating arrangement and imaging a circuit pattern formed on said mask on a substrate in the exposure area. With this structure, an extremely fine circuit pattern formed on the mask is imaged and transferred onto the substrate through the reduced projection lens to improve the contrast, thus realizing an exposure of high resolving power.

It is noted that although the present invention is hereinafter described in relation to use of excimer laser light, the present invention is not limited to a projection type exposure method using excimer laser light.

These and further objects, features and advantages of the present invention will become more obvious from the following description when taken in connection with the accompanying drawings which show for purposes of illustration only, several embodiments in accordance with the present invention.

BRIEF DESCRIPTION OF THE DRAWINGS

FIGS. 16(a)–(c) are views showing a ring-like filter.

FIGS. 18(a)–(c) show intensity distributions of a ring-like light source and a ring-like filter in accordance with an embodiment of the present invention.

FIGS. 19(a)–(c) intensity distributions of a ring-like light source and a ring-like filter in accordance with another embodiment.

FIG. 48 shows a relationship between a focal depth and contrast according to the present invention.

FIG. 50 is a block diagram arrangement of another embodiment of the entire exposure system using an excimer laser light source according to the present invention.

DESCRIPTION OF THE PREFERRED EMBODIMENTS

First, the principle of the present invention will be described with reference to FIGS. 1 to 7. In the present invention, a circuit pattern on a mask is transferred with an improved contrast rather than the art in which the circuit pattern is faithfully transferred onto a substrate by the imager (projection lens). Namely, in projection exposure, the requirement that "a circuit pattern is transferred accurately" is not always necessary the present invention is based on a new technical feature that "a circuit pattern desirably formed on a substrate (wafer) is better transferred with high contrast".

Figure 1A:
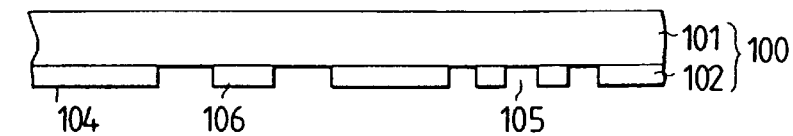
FIGS. 1(a) and (b) show a diffraction phenomenon of light by a circuit pattern formed on a mask for explaining the principle of the present invention.
Figure 1B:
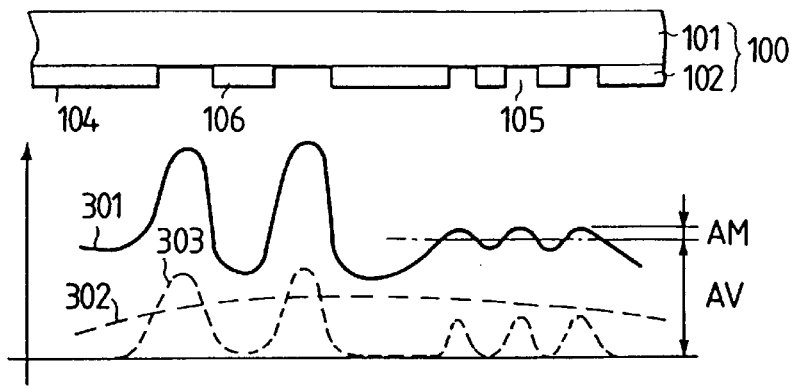
Figure 4:
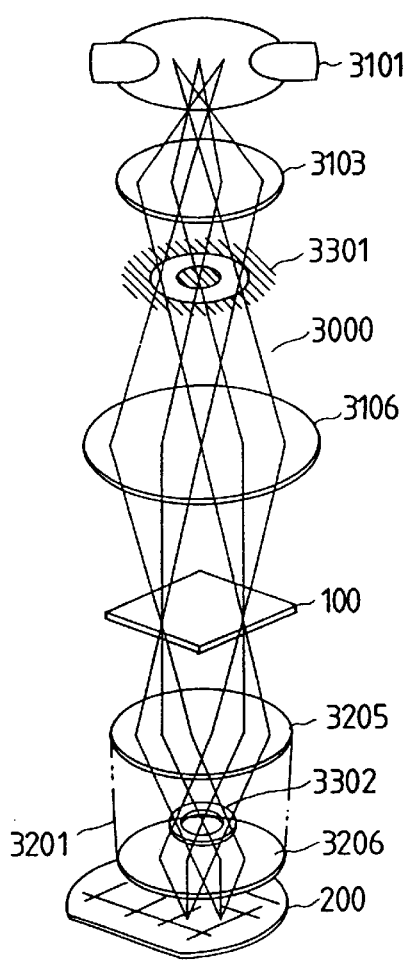
FIG. 4 is a schematic perspective view showing one embodiment of an exposure system in a reduction projection exposure device according to the present invention.
Figure 5:
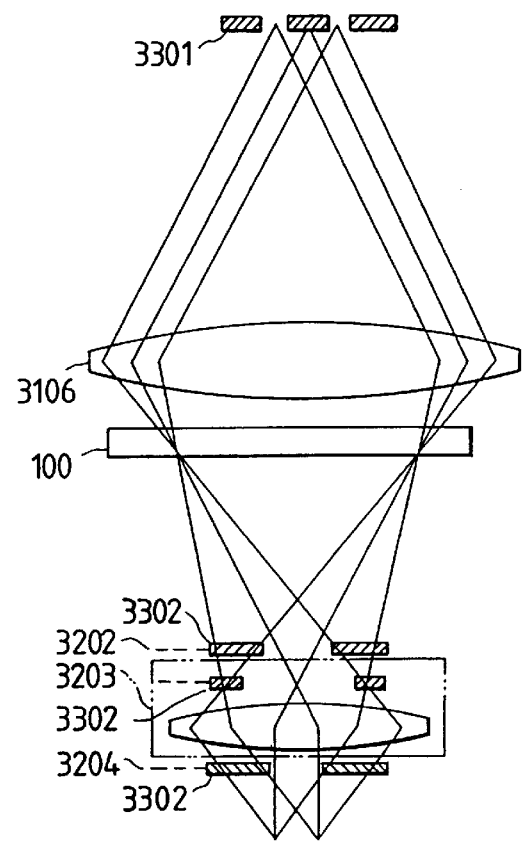
FIG. 5 is a sectional view showing a relationship between a light source spatial filter and an imaging filter in an exposure system according to the present invention.
Figure 6:
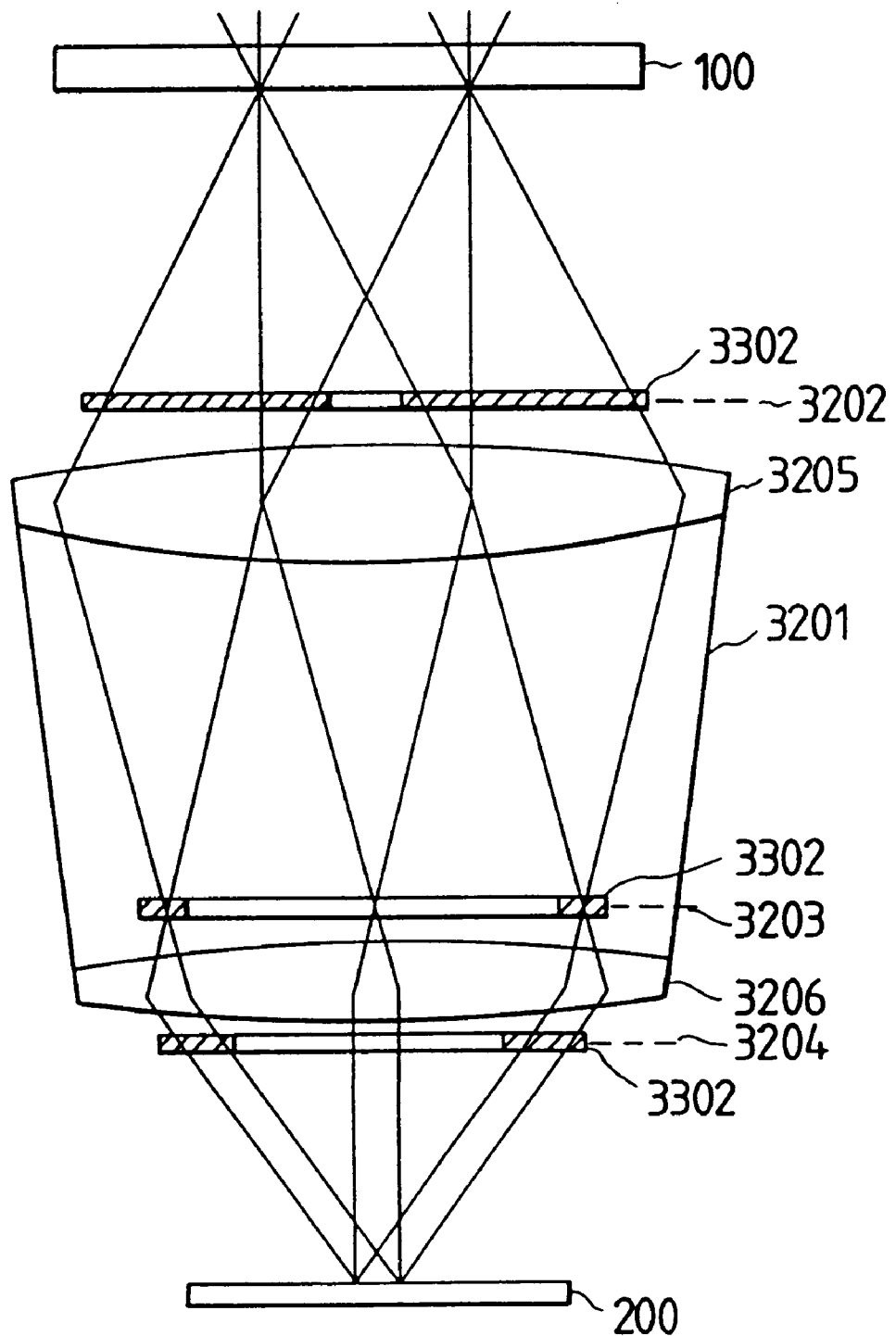
FIG. 6 is a sectional view showing a relationship of an imaging space in an exposure system according to the present invention.

FIG. 1 (a) is a sectional view of a mask 100 in which a mask circuit pattern 104 is formed on a glass substrate 101 by chrome 102. In FIG. 1(b), a waveform 301 shows, with respect to the mask circuit pattern 104, a signal distribution of an imaging pattern imaged onto a substrate (wafer) 200 by a projection and exposure device 3000 as shown in FIGS. 4 to 6. The waveform 301 is divided into a waveform 302 by the O-order diffraction light and a waveform 303 by higher order diffraction light. In the case where the mask circuit pattern 104 is a fine circuit pattern 105 as shown in FIG. 1(a), the waveform 301 detected is small in contrast AM/AV since the waveform 303 by the higher order diffraction light is small as compared with the O-order diffraction light. Since the component of the waveform 302 can be removed by shielding the O-order diffraction light, the detected waveform is high in contrast as in the waveform 302.

Figure 2A:
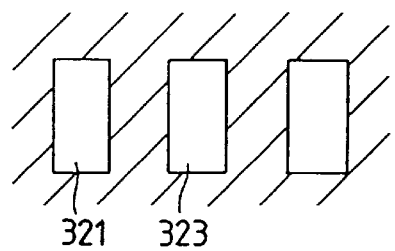
FIGS. 2(a) and (b) are views for explaining the principle of the present invention.
Figure 2B:
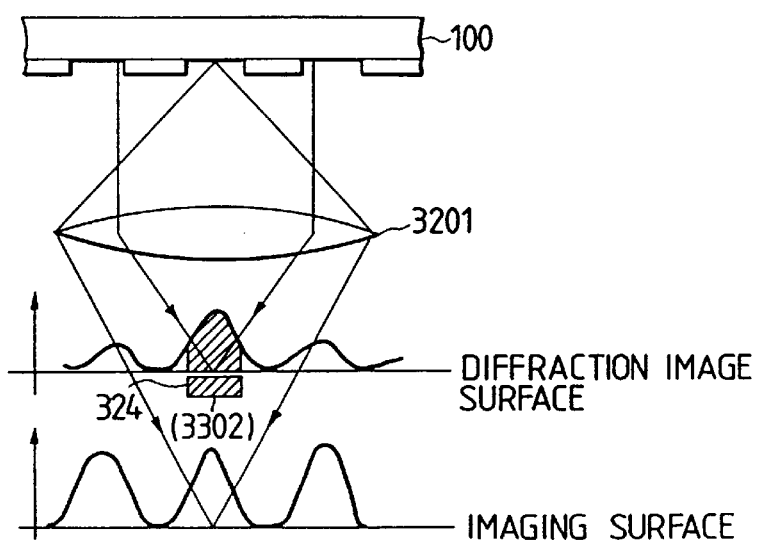
Figure 3:
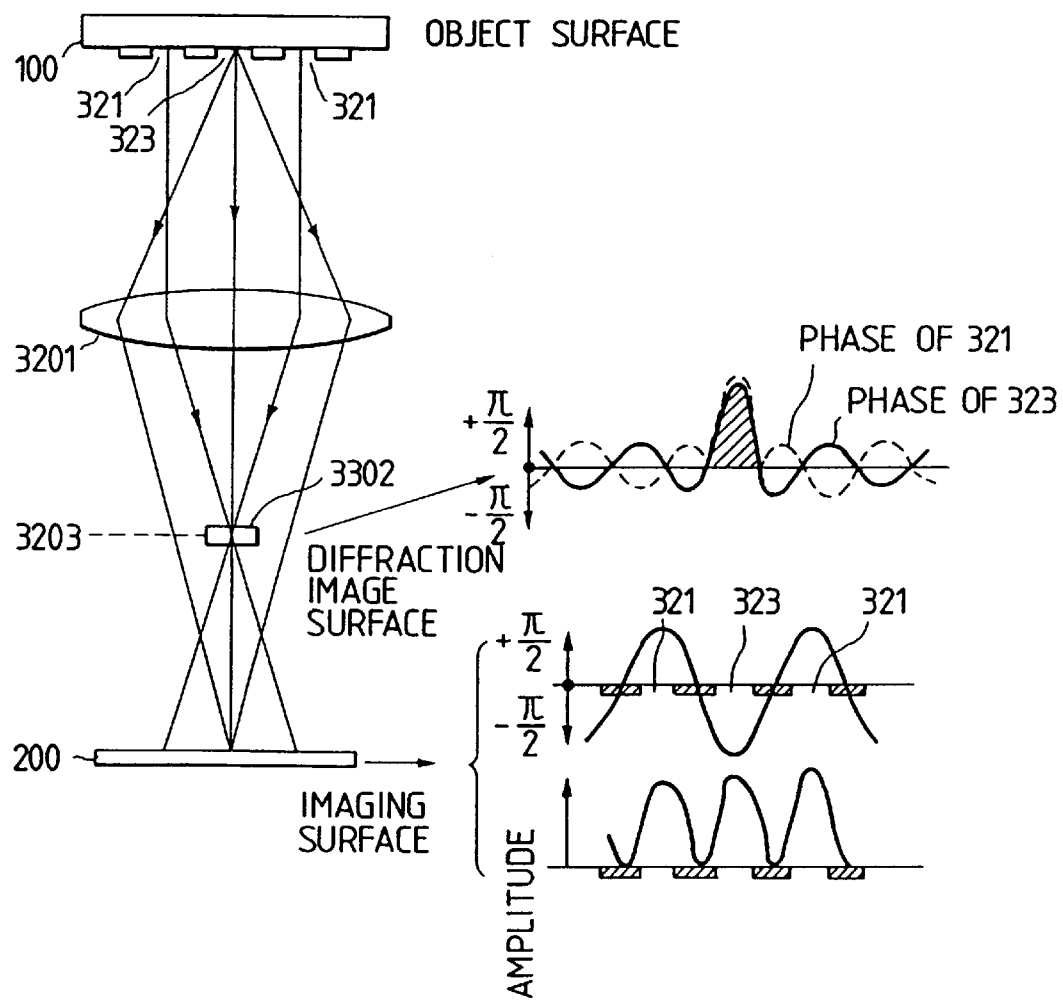
FIG. 3 is a view for further explaining the principle of the present invention.

A further principle of the present invention will be described hereinbelow. That is, the present invention is intended to invert phases of circuit patterns adjacent to each other on the mask (by D) without using a phase film. In the case where a shield portion between circuit patterns 321 and 323 adjacent to each other of a mask (reticle) 100 is narrow as shown in FIGS. 2 and 3, a completely complementary figure results, and in the case where the shield portion has a finite width, an approximately complementary figure results. The circuit patterns 321 and 323 adjacent to each other of the mask (reticle) 100 are equal in light intensity except at one central point (O-order diffraction light) with a phase deviated by D, in a Fraunhofer's diffraction image under the principle of Babinet, in a diffraction image surface 3203 by an imaging optical system (projection lens) 3201. In the diffraction image surface 3203 and in diffraction patterns other than the O-order diffraction light, light from the circuit patterns 321 and 323 is inverted in phase (deviated by π), and at least a part of the O-order diffraction light is shielded by a shield plate 324 (an imaging spatial filter 3302) on the diffraction pattern (diffraction image surface), whereby light imaged onto a substrate 200 surface (an imaging surface) is equal to that light from the patterns adjacent to each other whose phases are inverted (deviated by π) and an extremely fine circuit pattern with high contrast (an extremely fine circuit pattern of 0.1 µm or less on a wafer) can be transferred onto a substrate 200.

More specifically, as shown in FIG. 2 or 3, at least a O-order part of the diffraction light is shielded by the shield plate 324 (imaging spatial filter 3302) on the diffraction image surface whereby only the diffraction light with an inverted phase reaches the imaging surface and therefore, it appears as if a phase film is formed on the mask as viewed from the imaging surface. As a result, a circuit pattern which is the same as the phase shifter method is imaged onto the wafer, and in terms of intensity distribution of the imaging surface, an extremely fine circuit pattern with high contrast is obtained on the wafer 200 as compared with the case of a conventional reduction projection exposure shown in FIG. 7.

Figure 7A:
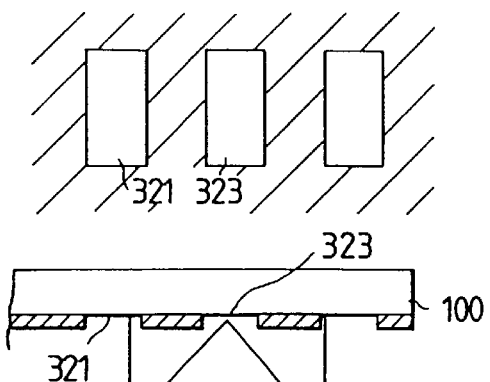
FIGS. 7(a) and (b) are views showing an imaging relationship of a circuit pattern on a mask in a conventional reduction projection exposure device.
Figure 7B:
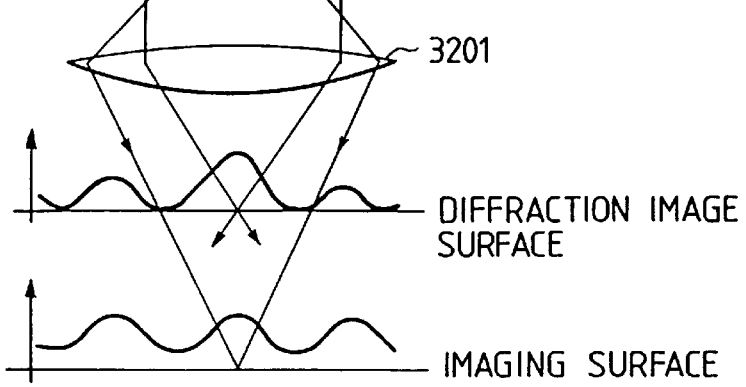

FIG. 7 is a view for explaining the case of the conventional reduction projection exposure, in which images of fine circuit patterns 321 and 323 adjacent to each other are high in contrast in the imaging surface. In short, in case of the reduction projection exposure according to the present invention, an extremely fine circuit pattern with high contrast (an extremely fine circuit pattern of 1 µm or less on a wafer) is transferred and exposed on the imaging surface as shown in FIGS. 2 and 3 as compared with the conventional reduction projection exposure shown in FIG. 7.

The example shown in FIG. 4 will be described hereinafter by way of expressions (formulae). In the example shown in FIG. 4, light from a mercury lamp 3101 is condensed at a light source spatial filter 3301 by a condenser lens 3103, and the mask 100 is illuminated by the condenser lens 3106. The light having transmitted through the mask is partly shielded by an imaging spatial filter 3302 and imaged on the wafer 200 by an imaging lens 3201. Let 1 (u, v) be the shape of the light source spatial filter 3301, f (x, y) be the shape of a pattern on the mask 100 and a (u, v) be the shape of the imaging spatial filter 3302, then the intensity gp (x, y) of an image on the wafer 200 is calculated by an expression (1) below:

$$gp(x, y) = \int\int\int_{-\infty}^{\infty} |\bar{F}^{-1}[\bar{F}[\bar{F}^{-1}[1(u, v)] * f(x, y)] * a(u, v)]|^2 \, du\,dv \quad (1)$$

$$\begin{cases} \bar{F}[f(x, y)] = \int\int f(x, y)\exp iw(ux + vy)dx\,dy \\ \bar{F}^{-1}[a(u, v)] = \int\int a(x, y)\exp -iw(ux + vy)du\,dv \end{cases}$$

In the expression (1), the intensity at the imaging surface is integrated after calculation since lights exited from (u, v) on the light source spatial filter 3103 are not interfered with each other. According to "Vibration Optics" (Iwanami Shoten) written by Kubota, generally, a resolving power of an optical system can be considered using a response function or OTF (Optical Transfer Function) of the optical system. A response function (u, v) in the example shown in FIG. 4 is calculated by the following expression (2) using a pattern f (x, y) on an object surface and the strength gp (x, y) of an image thereof.

$$h(x, y) = \int\int\int_{-\infty}^{\infty} |\bar{F}^{-1}[\bar{F}[\bar{F}^{-1}[1(u, v)] * \delta(x, y)] * a(u, v)]|^2 \, du\,dv \quad (2)$$

$$H(u, v) = \bar{F}[h(x, y)]$$

Figure 8:
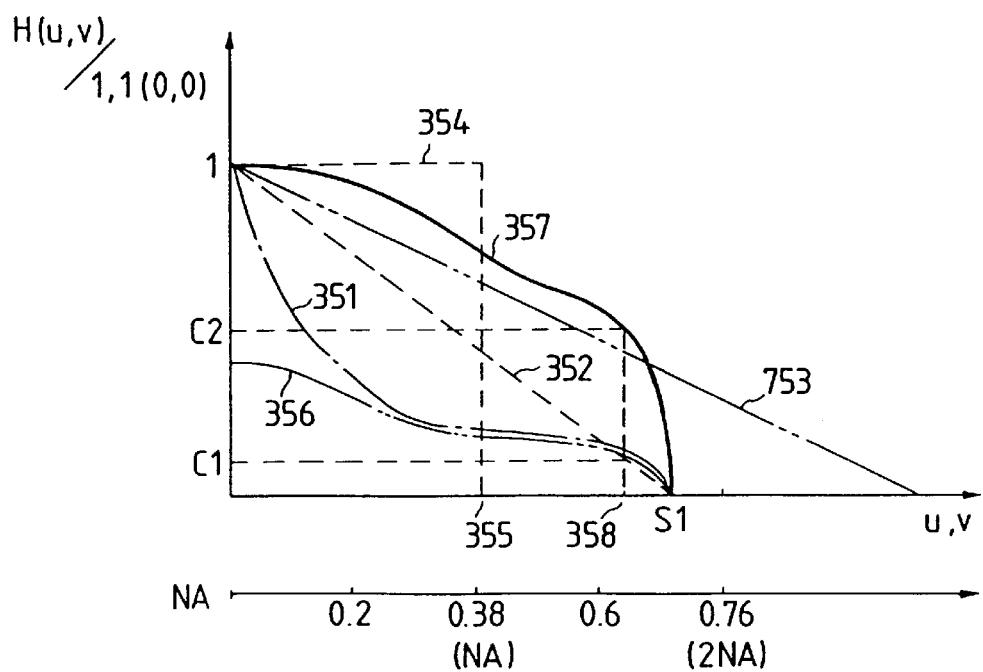
FIG. 8 is a graph showing response function of the system in accordance with the present invention.

FIG. 8 shows the response function of the optical system calculated for a curve 351. The abscissa indicates the spatial frequency s, and shows the number of openings (in case of NA=0.38) of the corresponding imaging lens for reference. The ordinate indicates the response function normalized by the O-order component. The position of point 355 indicates the size of an opening of the imaging lens. The curve 352 indicates the response function in the case where conventional optical systems, i.e. the light source spatial filter 3301 and the imaging spatial filter 3302 are not used; the curve 353 indicates the apparent response function by way of the phase shift method; and the curve 354 indicates the response function in the case where coherent light such as laser is used for reference. In the response function 352 according to the conventional method, the response function extends to a position S1 indicated by the following expression (3):

$$S1 = NA/\lambda + NA/\lambda - \sigma \quad (3)$$

The method of the present invention is the same as the conventional method in that the response function extends to the position shown in the above-described expression (3) but the curve is in the shape stabilized to the position of 0.6 from a portion near N.A.=0.2. Furthermore, in the present invention, the response function of a low frequency component is lowered by devising the shape of the mask pattern as described later so that the response function of the whole system according to the present invention has a shape of curve 356. A curve 357 is shown normalized, and a stabilized response function extends over a wide zone from the low frequency component to the high frequency component. Thereby, a fine pattern can be imaged with high contrast according to the present invention. More specifically, for example, a line and space of 3 µm is at a position of point 358, and this contrast is C1 in the conventional method whereas it will be a high value, C2, in the present invention. In the present invention, shapes of the light source filter 3301 and the imaging spatial filter 3302 are determined so as to optimize the response function calculated by the aforesaid expression (1). According to the present invention, the value of the response function of the high frequency component can be relatively increased by decreasing the response function of the low frequency component. In addition, a ring-like light source spatial filter can be used to extend the response function to the area set by the expression (3).

The size and width of the light source spatial filter 3301 and imaging spatial filter 3302 can be optimized by calculating the response function using the aforesaid expression (2).

The method for calculating the imaging state at the wafer 200 by simulation to confirm the shape of a mask will be described later but the expression (1) cannot be analytically solved, and numerical calculation based on the expression (1) is used for calculation. When the response function capable of being calculated by the expression (2) is obtained and calculated by the expression (4) below, calculation time can be shortened.

$$gp(x, y) = |\bar{F}[H(u, v) * \bar{F}[f(x, y)]]|^2 \quad (4)$$

A method for determining shapes of a light source spatial filter 3301 and an imaging spatial filter 3302 is shown in FIGS. 9 to 14. An optical system of the present invention is an optical system of so-called partial coherent imaging. An optical system of partial coherent imaging that cannot be fully explained using a so-called response function is explained in "Stepper's Optics" (Optical Technical Contact, Vol. 27, No. 12, pp. 762–771). The imaging characteristics of the optical system using a ring-like light source and a ring-like spatial filter according to the present invention on the basis of the aforementioned concept are calculated.

The imaging characteristic of the partial coherence imaging is calculated by expression (5) below using the concept of Transmission Cross-Coefficient, $T(X_1, X_2)$ showing the relationship between a shape of a light source and a shape of the pupil surface of a detection optical system. According to the aforementioned "Stepper's Optics", OTF 20 (Optical Transfer Function) of the optical system is determined by Transmission Cross-Coefficient, T(x, 0) of the minimum order. T(x, 0) is shown by the relative function between the shape of the light source and the shape of the pupil surface.

$$gp(v) = \int\int T(x_1, x_2)f(x_1)\hat{f}^*(x_2)\exp[-2\pi i v \cdot (x_1 - x_2)]dx_1 dx_2$$

where v=(x, y) . . . Coordinates on image surface
$x_1=(u_1, v_1)$ Coordinates on pupil $(u_2, v_2)$ surface
$f(x_1)$ . . . Intensity distribution on image surface
^ . . . Fourier conversion
* . . . Conjugate complex number $$T(x_1, x_2) = \int l(x_3)a(x_1 + x_3)a^*(x_2 + x_3)dx_3 \quad (5)$$

Figure 9:
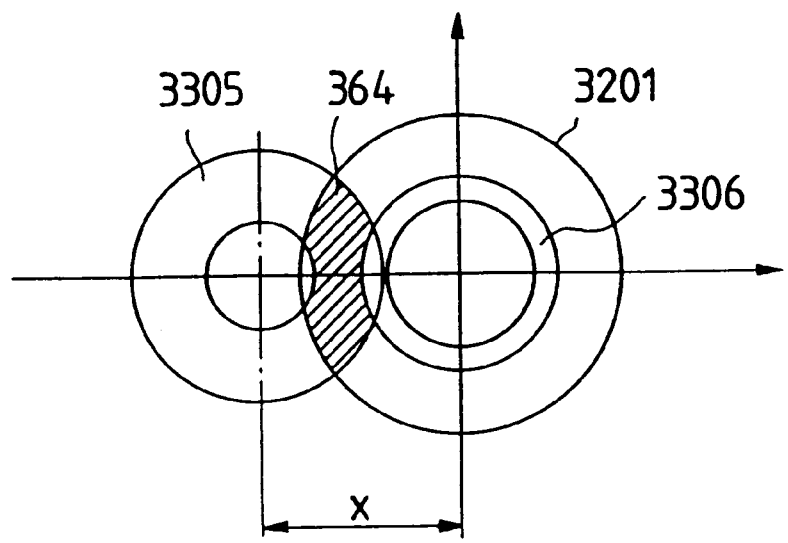
FIG. 9 is a view for explaining the relative function between the shape of the light source and the shape of the pupil surface according to the present invention.

That is, the characteristic of the partial coherent imaging shown by the complicated expression (5) poses a problem of geometry which is the relative function between the shape of the optical source and the shape of the pupil surface. FIG. 9 shows a light transmission portion 3305 of a light source spatial filter 3301 and a light shield portion 3306 of an imaging spatial filter 3302. The relative function between the light source and the pupil surface with coordinates x is shown by an area of an oblique line portion or hatched portion 364 in FIG. 9. Similarly, the relative function between the light source and the pupil surface in the prior art is shown by an oblique line portion or hatched portion in FIG. 10.

Figure 10:
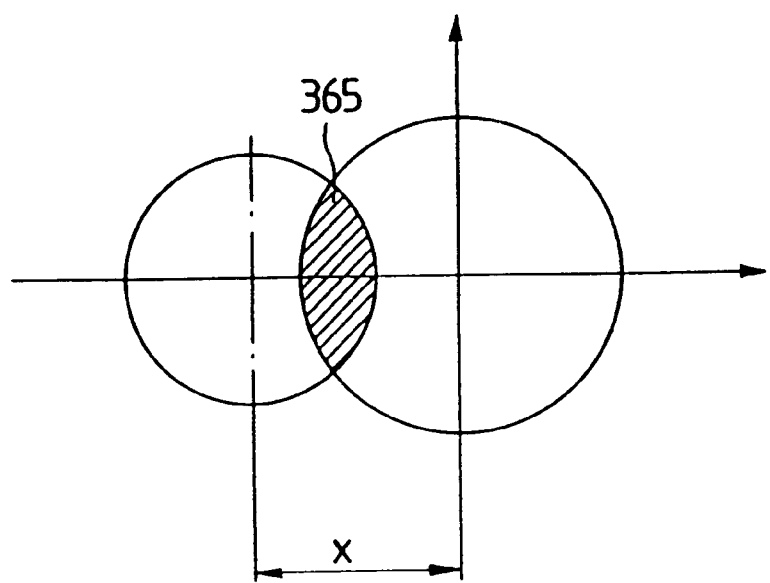
FIG. 10 is a view for explaining the relative function between the shape of the light source and the shape of the pupil surface according to the prior art.
Figure 13:
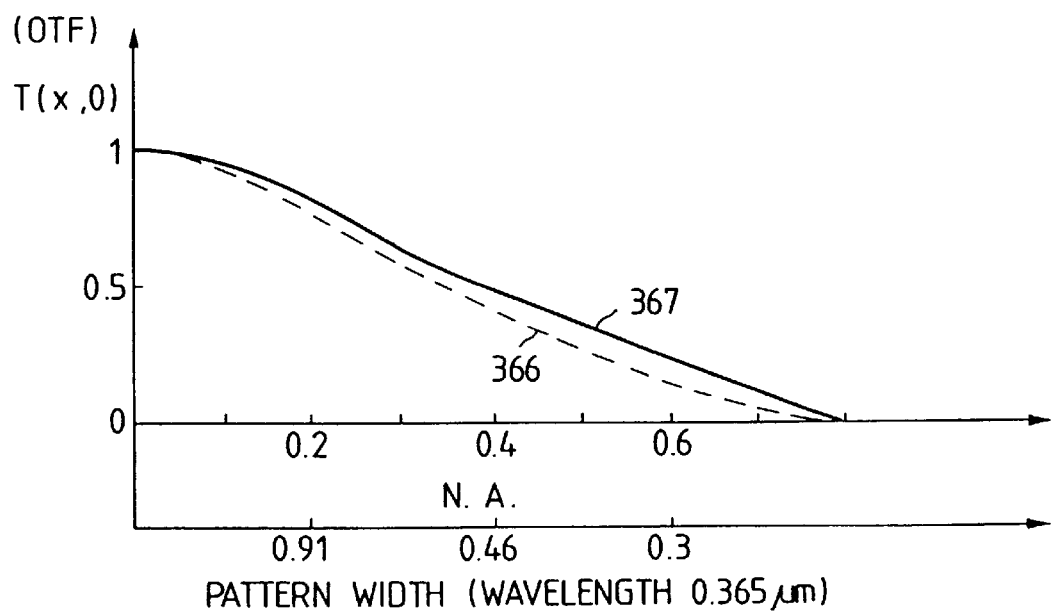
FIG. 13 is a view showing the calculated result of OTF according to the present invention.

A curve 367 in FIG. 13 shows a calculated value of the relative function in the case of FIG. 9, in other words, Transmission Cross-Coefficient, T(x, 0). The relative function in case of the prior art shown in FIG. 10 is large in value in a high frequency area as compared with the curve 366. That is, the contrast increases. FIG. 13 shows the calculated result in case of N.A.=0.38, σ=0.9. In FIG. 13, an abscissa shows the minimum pattern dimension corresponding to each N.A. in the case where wavelength is 0.365 micron. (For example, 0.3 means line and space of 0.3 micron.) It is understood that OTF of 0.3 micron is about twice as large as that of the prior art.

Figure 11A:
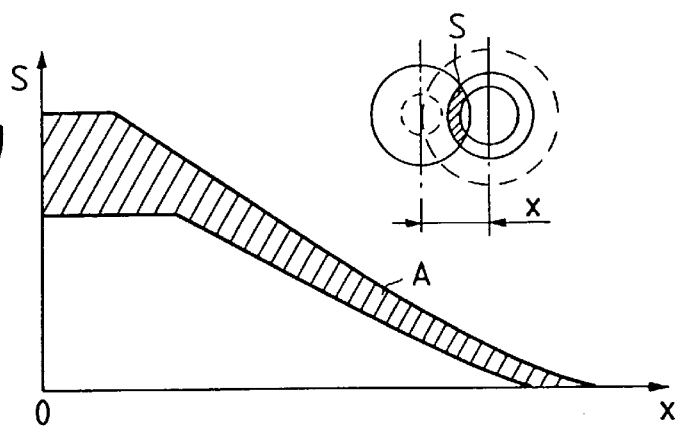
FIGS. 11(a)–(c) are views for explaining the calculating method of the relative function between the shape of the light source and the shape of the pupil surface.
Figure 11B:
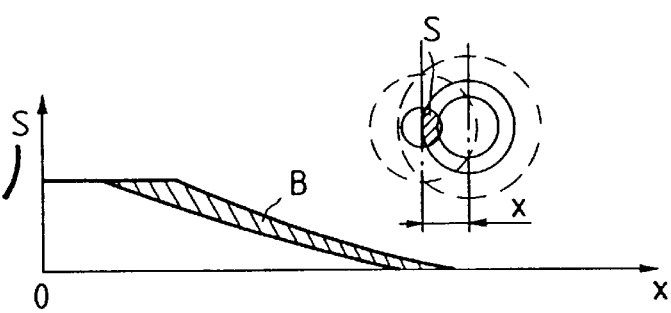
Figure 11C:
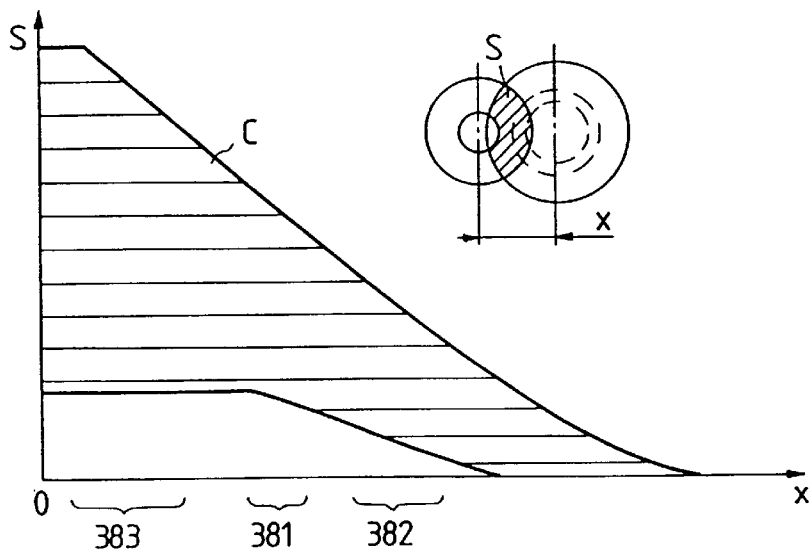
Figure 12:
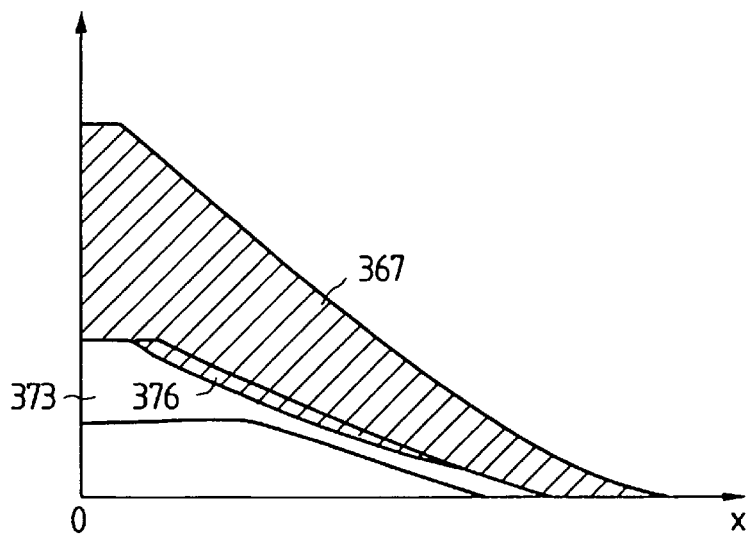
FIG. 12 is a view for explaining the calculating method of the relative function between the shape of the light source and the shape of the pupil surface.

FIGS. 12 and 13 are views for increasing the intuitive understanding of and helping the setting of shapes of the light source spatial filter 3301 and the imaging spatial filter 3302. A hatched portion A in FIG. 11(a) shows the relative function between the outer diameter of the light source and the shield portion 3306, and a hatched portion B in FIG. 11(b) shows the relative function between the inner diameter of the light source and the shield portion 3306. A hatched portion C in FIG. 11(c) shows the relative function between the transmission portion 3305 of the light source and the maximum pupil of the optical system. The relative function between the final light-source shape and the spatial filter is shown by the hatched portion 367 in FIG. 12. This can be obtained by C−A+B. By obtaining the relative functions as described above, the effect of the spatial filter or ring-like illumination can be intuitively understood, and conversely, that is helpful in determining the shape thereof. More specifically, the value of the high frequency area 382 is larger in value than the intermediate frequency area 381. In the case where the value of the low frequency area 383 is excessively large, the value of the low frequency area is further reduced from the effects A and B of the spatial filter. In this way, the effect of the ring-like illumination and the spatial filter is intuitively explained.

Of course, the shape of the light source and the shape of the spatial filter should be evaluated on the basis of expression (5) and should be approximately evaluated by the relative function between the light source and the spatial filter.

Since the ring-like light source can make the coherence high, the depth of the optical system can be increased. The narrower the band width of the ring-like power source the higher the coherence of the light source. Thus, the focal depth increases. The larger the diameter of the ring of the ring-like light source the greater the coherence degree of space. Thus, the resolution increases.

Figure 15A:
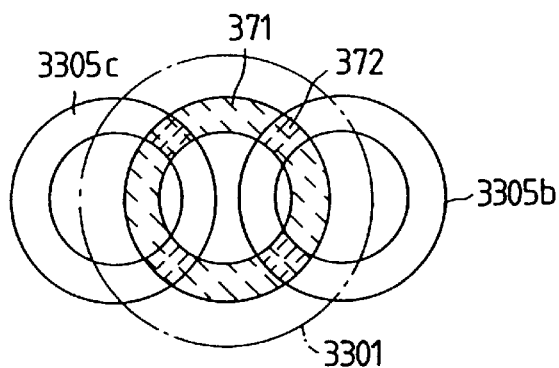
FIGS. 15(a)–(b) are views for explaining the effect of a ring-like light source and a ring-like filter.
Figure 15B:
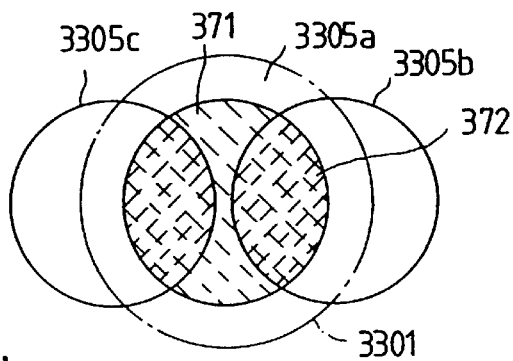

The effects of the ring-like light source and ring-like spatial-filter used in the present invention will be described with reference to FIG. 15. FIG. 15(a) shows an eye 3301 of an imaging lens, an image 3305a (the 0-order diffraction light) of a light source imaged on the eye, and diffraction images 3305b and 3305c of a light source resulting from a pattern (a circuit pattern) formed in a direction of y on a mask 100. FIG. 15(a) shows the case where the light source is ring-like, and FIG. 15(b) shows the case where the light source is circular. A filter for shielding the 0-order diffraction light is shown by an hatched portion 371. A cross-hatched portion 372 which is also a part of the diffraction light 3305b and 3305c of the light source is simultaneously shielded by the oblique line 37. In case of FIG. 15(a), only 10% to 20% are shielded, but in case of FIG. 15(b), 40% or more are shielded. That is, the object for efficiently shielding only the O-order diffraction light is effectively achieved by the ring-like light source of FIG. 15(*a*). Namely, the ring-like light source is improved in performance. The smaller the width of the ring-like light source, the smaller the ratio of the diffraction light to be shielded becomes.

Figure 16A:
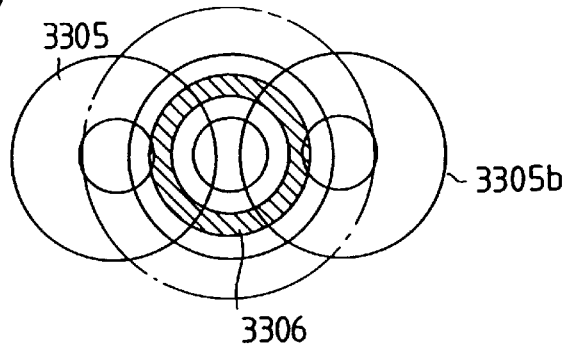
Figure 16B:
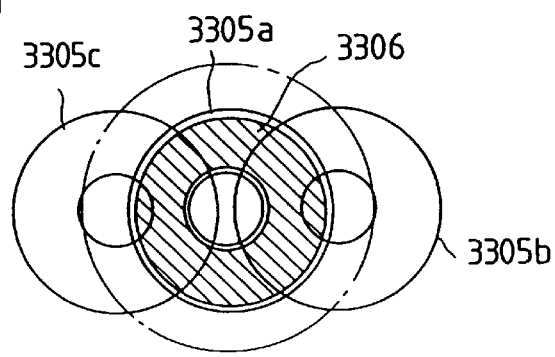
Figure 17A:
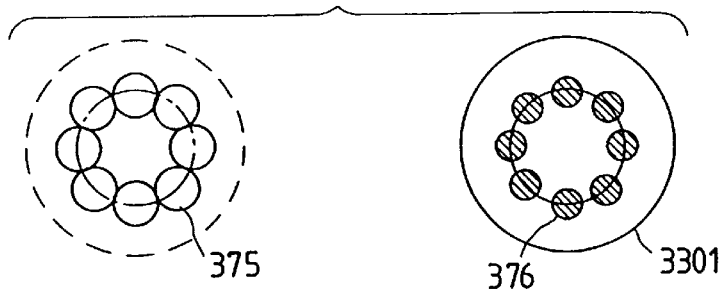
FIGS. 17(a)–(c) are views showing a ring-like light source and a ring-like filter.
Figure 17B:
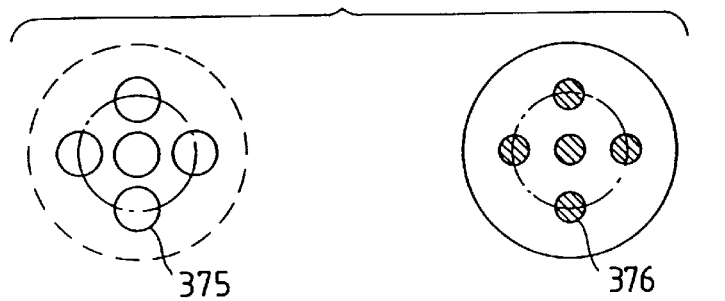
Figure 17C:
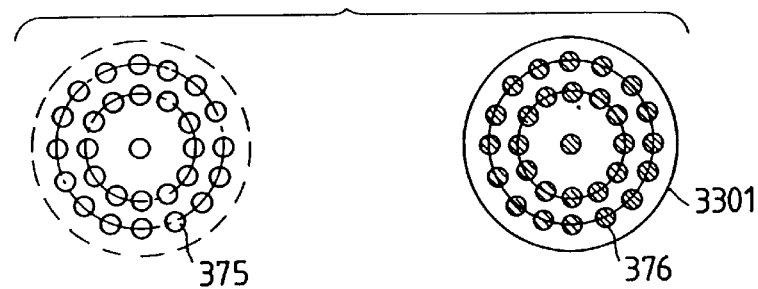
Figure 17D:
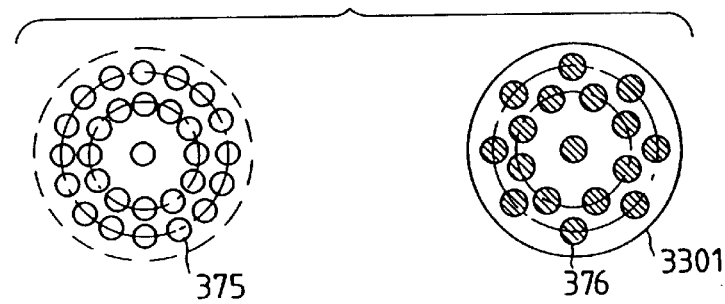
Figure 40A:
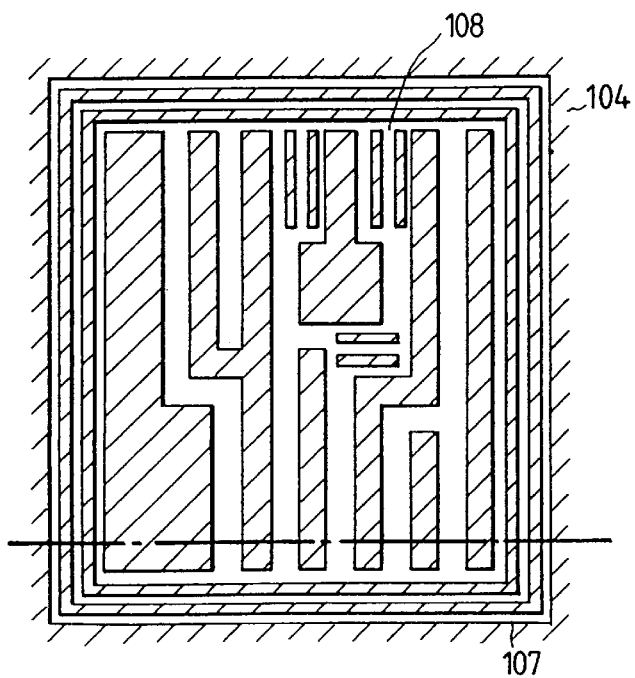
FIGS. 40(a) and (b) show a plan view and a sectional view of one example of a mask pattern for obtaining the wafer pattern shown in FIG. 38 according to the present invention.
Figure 40B:
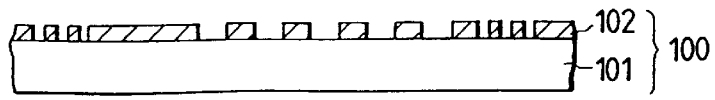

In the present invention, a spatial filter 3306 having a ring width of narrowness about 30% of the ring width of the light source as shown in FIG. 16(*a*) is used in order to shield a part of the O-order diffraction light. However, since a part of the O-order diffraction light will suffice to be shielded, a spatial filter as shown in FIG. 40(*b*) can be used in which the ring width is substantially the same as the light source and the transmittance is approximately 70%. Of course, the ring width can be made smaller than that of the image of the light source and the transmittance can be lowered than 70%. Furthermore, while here, the case where the light transmittance is 30% or less, it is to be noted that the light transmittance is not limited to 30%. It is to be further noted that as a spatial filter portion 3306, use can be made of a phase plate in which the transmittance is 100% and a phase at the using wavelength is deviated by $\pi$ in order to shield a part of the O-order diffraction light. Such a filter may serve as a filter for substantially shielding a part of the O-order diffraction light. Furthermore, polarized light and a polarizing plate may be used for shielding.

Figure 26:
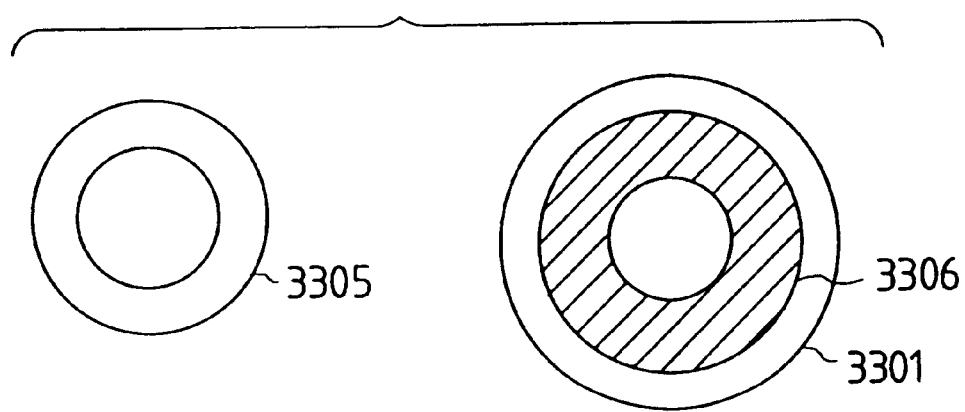
FIG. 26 show another embodiment of a ring-like light source and a ring-like filter.

Further, as shown in FIG. 26, the ring width of the filter in which transmittance is 70% may be made larger than that of the light source. With this structure, not only the O-order diffraction light, but also a part of the low-order diffraction light can be shielded, and an MTF curve can be improved. Also in an example shown in FIG. 16(*a*), a structure is shown in which a part of the low-order diffraction light is shielded as in the example of FIG. 26.

As described above, in order to efficiently shield the O-order diffraction light, the ring-like light source exhibits the effect. When the width of the ring is made small, the effect increases. It can be here considered that a ring-like light source comprises light sources aligned in a ring-like fashion. That is, it can be considered as an assembly of coherent point sources. Thus, the object of the present invention is achieved even by the provision of an assembly of light sources 375 having a spatial coherence in the order of 0.1 to 0.3 close to point sources and shield plates 376 smaller than the light sources 375 positioned corresponding thereto. Needless to say, the shield plate 376 of low transmittance may be used. FIG. 17(*a*) shows an example in which the light sources 375 and the shield plates 376 are aligned in a ring-like fashion. When this type of arrangement is employed, the shielding of the O-order diffraction light is achieved even if the ring-like shape is not formed, as shown in FIG. 17(*b*). At the same time, several plies of light sources and shield plates can be aligned as a ring, as shown in FIG. 17(*c*). A shield plate may be mounted with respect to only a part of the corresponding light source in order to shield a part of the O-order diffraction light as shown in FIG. 17(*d*).

Figure 18A:
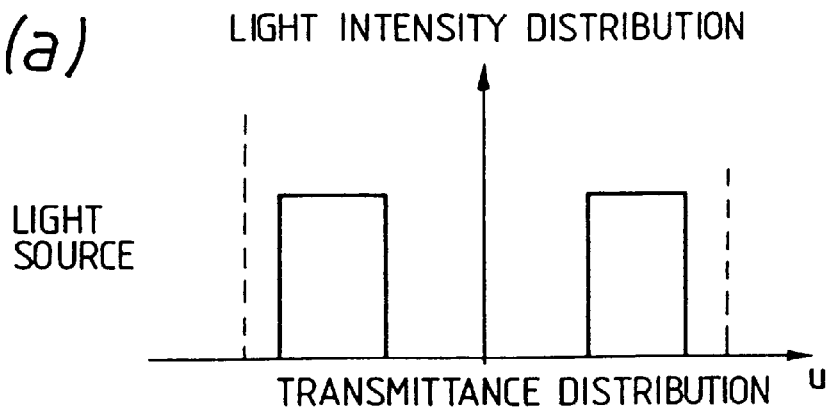
Figure 18B:
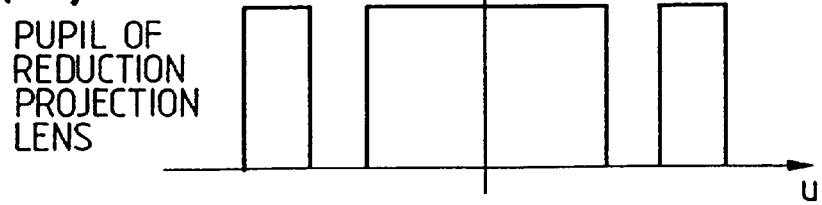
Figure 19A:
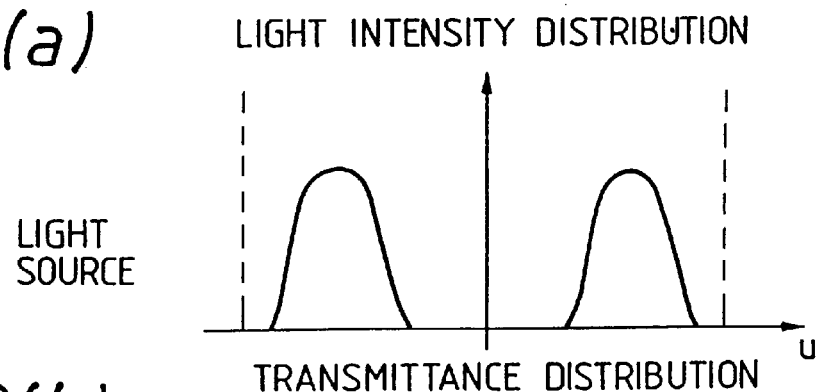
Figure 19B:
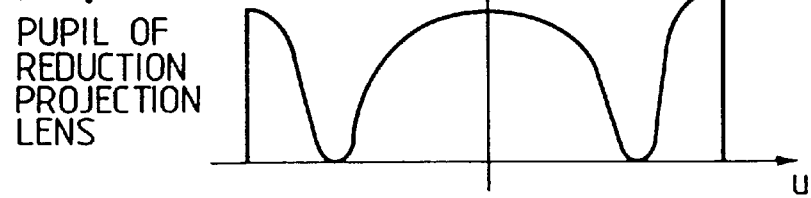

FIGS. 18(*a*) and 18(*b*) show the distribution of light intensities of a light source and the transmittance of a spatial filter in connection with the radius direction. While in FIG. 18, both the light intensity distribution and transmittance distribution are shown in the rectangular distribution, it is to be noted that a gentle distribution as shown in FIG. 19(*a*) and 19(*b*) may be employed without problem. This can be understood if one considers that OTF is shown by their relative functions. That is, since an integrated one while taking weighting is the relative function with respect to duplicated portions, even if the gentle distribution is exhibited, the value of the relative function does not change greatly. In any case, radially equal distributions and concentrical distributions are obtained, which are important. The fact that the light source described herein may have the distribution as shown in FIG. 19(*a*) indicates that the intensities of the light sources shown in FIGS. 17(*b*), (*c*) and (*d*) become small toward the center. In such an embodiment, there are effects in that a light source with less coherency can be prepared and at the same time a frequency component can be further made small.

As described above, in the present invention, the effective shielding of a part of the O-order diffraction light by the exposure apparatus or other imaging optical systems enabling the enhancing of the resolution and enhancing of the focal depth. However, in order to efficiently shield the O-order diffraction light, it is necessary not to superpose the O-order diffraction light and the diffraction light on a Fourier transform surface in which a spatial filter is arranged, but where they are separated. To this end, the coherency of the illuminated light should be high. That is, it is desirable to be close to a point source. On the other hand, in order to enhance the resolution of the imaging optical system, it is desirable to increase the spatial, coherence of the light source, namely, the $\alpha$ value. That is, a large light source is desired. As a contradiction to each other (a point source and a large light source) need be compatible. The ring-like light source and the spatial filter according to the present invention makes such contradiction as noted above compatible. One way of efficiently fulfilling this is to use an assembly of small light sources. Further, if this assembly is arranged in the form of a large ring, the condition of a large light source is fulfilled. That is, if the width of the ring is made small, the coherency increases and the focal depth enhances, whereas if the radius of the ring is made large, the spatial coherency increases and the resolution enhances.

There is present a condition that when the radius of the ring increases while shielding a part of the O-order diffraction light, the diameter of the spatial filter 3306 becomes about the same as that of the eye of the optical system. This condition is a condition that a part of the O-order diffraction light is shielded and the size of the ring-like light source is maximum. That is, this is a condition that the maximum resolution is obtained in connection with the reduction projection lens. FIGS. 20(*a*), (*b*) and (*c*) show such arrangement. In these embodiments, the size of the light source is larger than the lens eye.

Generally, it has been said that when the size of a light source is increased, the focal depth becomes shallow, and cannot be properly used for lithography. However, as already explained above, a ring-like light source can be used to thereby make the focal depth deep. Therefore, it is possible to use a light source larger than an eye as shown in FIG. 20. The individual embodiments have a structure in which a part 377 of the O-order diffraction light is shielded. The OTF of this structure is indicated by the relative function. Therefore, there is an effect that the shut-off frequency of the OTF is extended in comparison to the case where the size of a light source is smaller than an eye. Furthermore, a further effect obtained by this structure lies in that the resolution can be enhanced only by an improvement in an illuminating system which facilitates a large N.A. implementation without using a reduction projection lens which requires high precision. In this embodiment, it is possible to transfer a pattern of approximately 0.2 $\mu$m with a wire i using a lens of N.A. 0.4.

Figure 21:
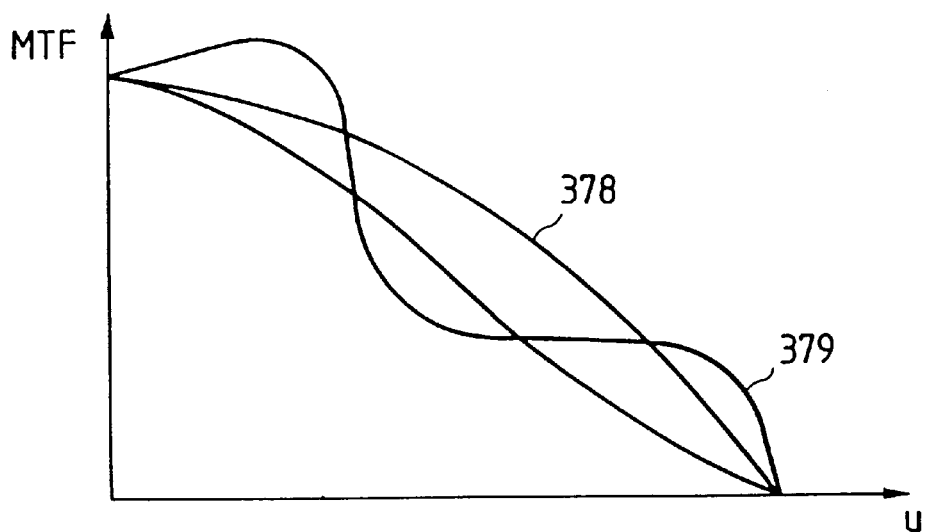
FIG. 21 shows OTF curves.
Figure 22:
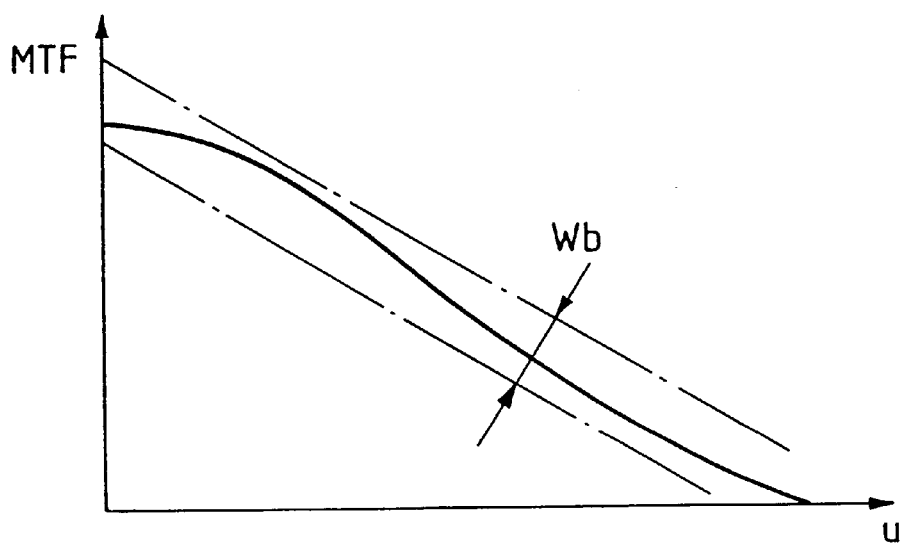
FIG. 22 shows other OTF curves.

It is important for an imaging system of the O-order diffraction light shield to gently and monotonously reduce an OTF curve. FIG. 21 shows an OTF curve 378 according to the present invention. In the case where the OTF is not a gentle or smooth curve, but rather is wavy as shown by curve 379, the contrast in the vicinity of an extremely small point of the wave lowers, and in an actual LSI pattern having various spatial frequency components, the pattern is not properly transferred. However, a special pattern formed from only specific spatial frequency components is not included herein, and the contrast will suffice to be increased with respect to the specific spatial frequency. That is, the OTF curve need be in the range of the specific width Wb as shown in FIG. 22. This Wb should be calculated from the transfer result calculated by a transfer simulator later described.

Accordingly, also in the case where a light source shown in FIG. 20 is large, the OTF which gently and monotonously reduces is required. It is desired from this that when a pattern of actual LSI is transferred, a difference between an inner diameter of a light source and a diameter of an eye of a reduction projection lens is substantially equal to a difference between an outer diameter of a light source and a diameter of an eye of a reduction projection lens. In order to obtain an actual focal depth, it is desired that the ratio between the eye diameter of the reduction projection lens and the inner diameter is 0.6 or more.

Figure 20A:
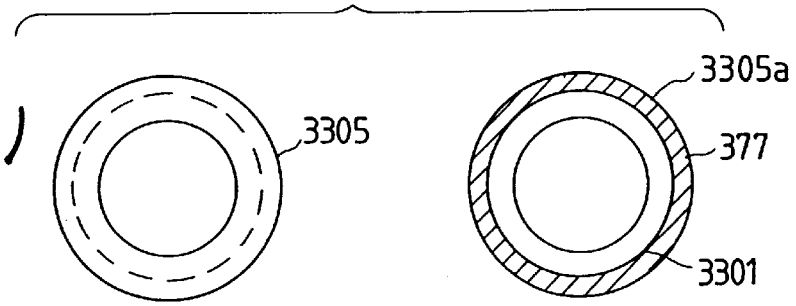
FIGS. 20(a)–(c) show the embodiments of a ring-like light source and a ring-like filter.
Figure 20B:
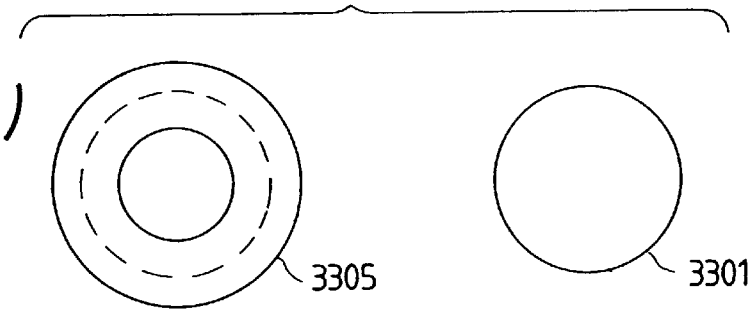
Figure 20C:
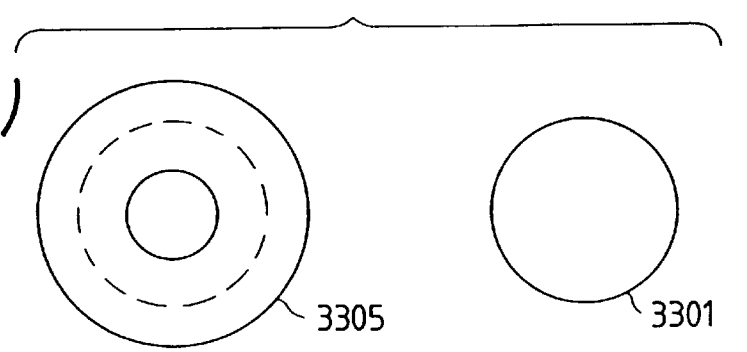
Figure 25:
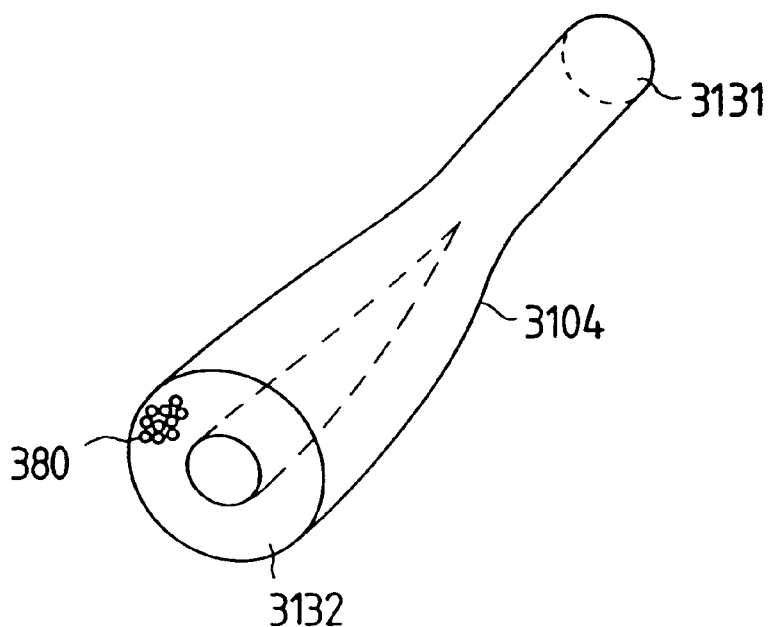
FIG. 25 show one embodiment of an integrator.

In the example of FIG. 20(a), a filter having a transmittance of a suitable value may be arranged at a portion of a portion 380, as shown in FIG. 25, exposed to the O-order diffraction light of the light source within the eye of the reduction projection lens. In this case, it is possible to reduce the width of a portion 377 externally of the eye of the light source, and thus, there is also an effect that the size of the light source can be reduced.

Conversely, it is possible to increase the width of a portion 380 in the eye of the reduction projection lens as compared with portion 377. This brings forth effects such that a stabilized contrast is easily maintained in a wide area where the light intensity is easily increased.

Furthermore, even if the outer diameter of the light source of the ring is made to be the same as that of the eye of the reduction projection lens, the object of the present invention can be achieved to some extent. In the structure shown in FIG. 20(a), a spatial filter is not introduced into the eye of the reduction projection lens so that a part of the O-order diffraction light can be cut. Therefore, the structure is simple and the operation can be easily performed.

Figure 23:
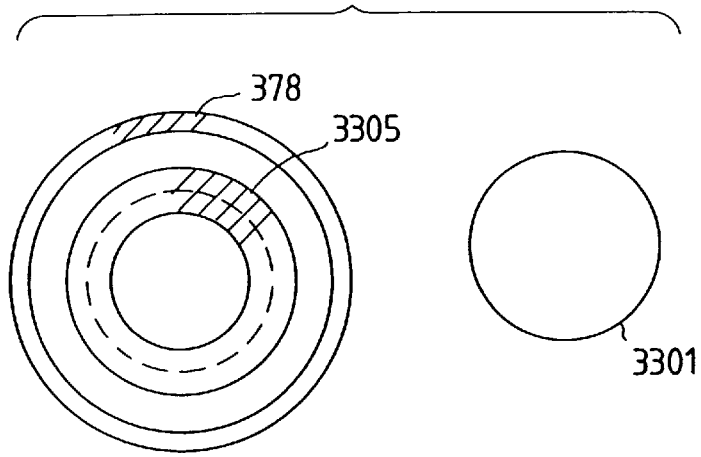
FIG. 23 shows another embodiment of a ring-like light source and a ring-like filter.
Figure 24:
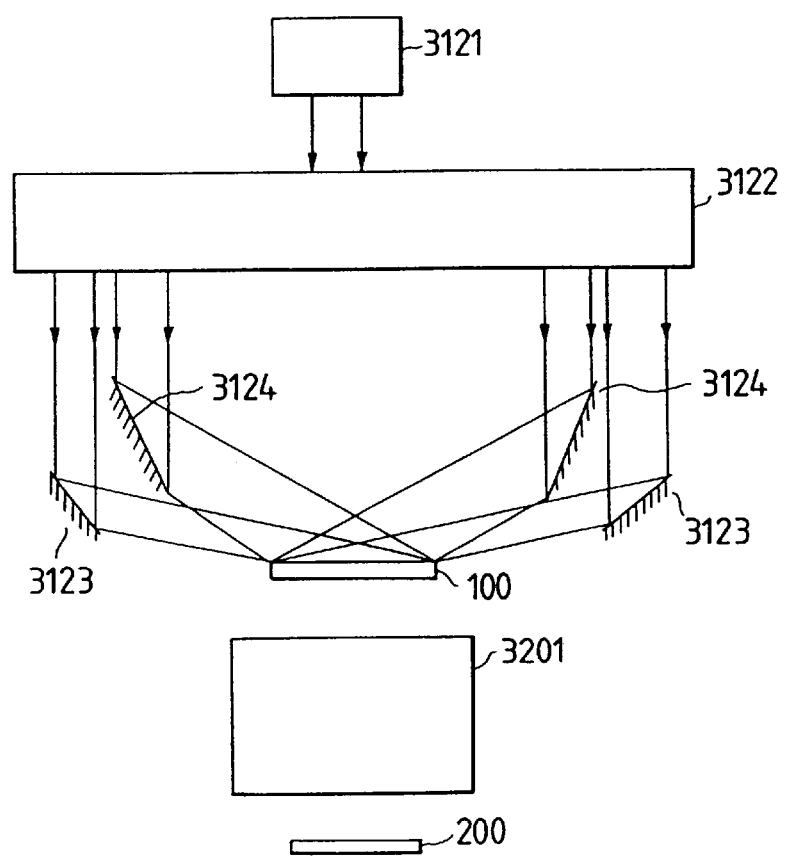
FIG. 24 is a view showing a block diagram of an embodiment of a light source.

Moreover, as shown in FIG. 23, a ring-like light source 378 is installed externally of the light source shown in FIG. 20 to further enhance the resolution. FIG. 24 shows an example in which the light source shown in FIG. 23 is embodied. Since the light source with N.A. increased as described above is difficult in the lens system, a laser light source 3121, a beam scanning means 3122, ring-like mirrors 3123 and 3124 are used. In the case of this embodiment, a lens of N.A. 0.4 of i wire is used, and 0.15 $\mu$m can be resolved. Such embodiment does not differ from the fundamental idea of the present invention in that a part of the O-order diffraction light is shielded.

One embodiment of a pattern transfer system 3000 (a reduction projection exposure optical system) according to the present invention will be described hereinbelow with reference to FIGS. 4 to 6. In the pattern transfer system (reduction projection exposure optical system) 3000, an i-ray having a wavelength of 365 nm out of light from a Hg lamp 3101 is selectively transmitted by a color filter 3102, and the light is condensed on the surface of an integrator 3104 by a condenser lens 3103. Light incident upon elements 3107 (FIG. 28) in the integrator 3104 are individually emitted with an angle of exit $\alpha$, and a mask 100 is illuminated by a condenser lens 3106. The integrator 3104 will be described later. A ring-like light source spatial filter 3301 is installed in the vicinity of an output end of the integrator 3104.

The light having transmitted through a mask circuit pattern 104 (shown, for example, in FIG. 39) on the mask 100 and diffracted is imaged and transferred as a wafer circuit pattern 204 (shown, for example, in FIG. 37) having a high contrast on the wafer (substrate) 200 through an imaging lens (reduction projection lens) 3201 and an imaging spatial filter 3302 mounted in the vicinity of a pupil of the imaging lens.

Figure 32:
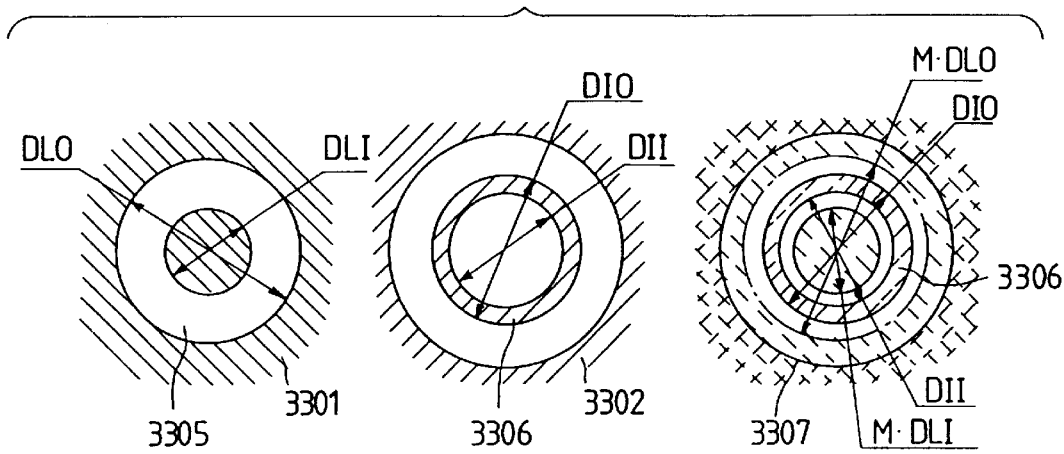
FIG. 32 is a plan view showing a relationship between a light source spatial filter of one embodiment and an imaging spatial filter of one embodiment according to the present invention.
Figure 33:
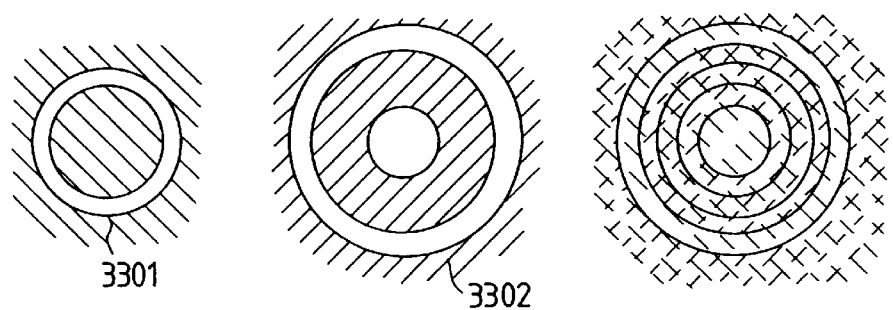
FIG. 33 is a plan view showing a relationship between a light source spatial filter of another embodiment and an imaging spatial filter of another embodiment according to the present invention.
Figure 34:
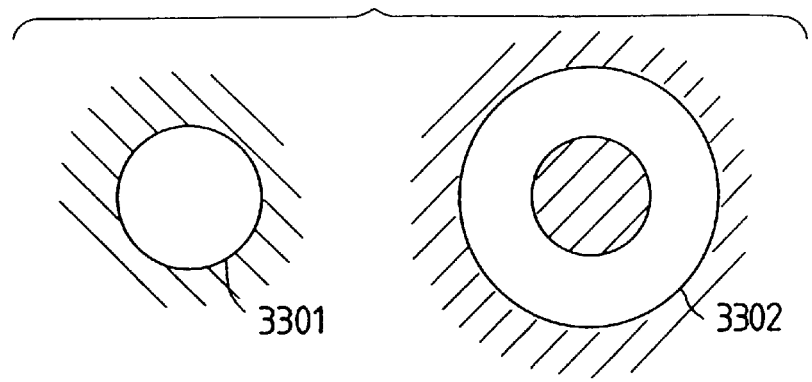
FIG. 34 is a plan view showing a light source spatial filter of a further embodiment and an imaging spatial filter of a further embodiment according to the present invention.
Figure 35:
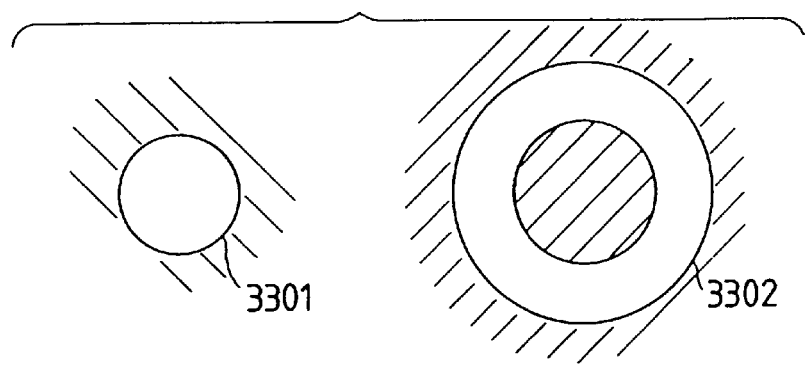
FIG. 35 is a plan view showing a light source spatial filter of another embodiment and an imaging spatial filter of another embodiment according to the present invention.

It is noted that an image of a light source spatial filter 3301 in the form of a ring is imaged at a position of an imaging spatial filter 3302 in the form of a ring by the condenser lens 3106 and the imaging lens (reduction projection lens) 3201. The imaging relationship between the light source spatial filter 3301 and the imaging spatial filter 3302 in the present embodiment is shown in FIGS. 32 and 33. The light source spatial filter 3301 forms a light source of a ring portion 3305 having an outside diameter DLO and an inside diameter DLI, and both inside and outside of the ring portion 3305 are shielded. The imaging spatial filter 3302 has a construction in which a ring portion 3306 having an outside diameter DIO and an inside diameter DII is shielded, and light transmits through both inside and outside of the ring portion 3306. An incident portion of the imaging lens (reduction projection lens) 3201 is indicated at 3205 and an exit portion is indicated at 3206.

The imaging spatial filter 3302 may be at a position 3202 in front 3205 of the imaging lens (reduction projection lens) 3201, at a position 3204 at the rear 3206 of the imaging lens 3201 or at a position 3203 of a pupil in the imaging lens. The best effect in design is obtained at the position 3203, and a position at which cost is minimum and sufficient effect is obtained is the position 3204.

Figure 31:
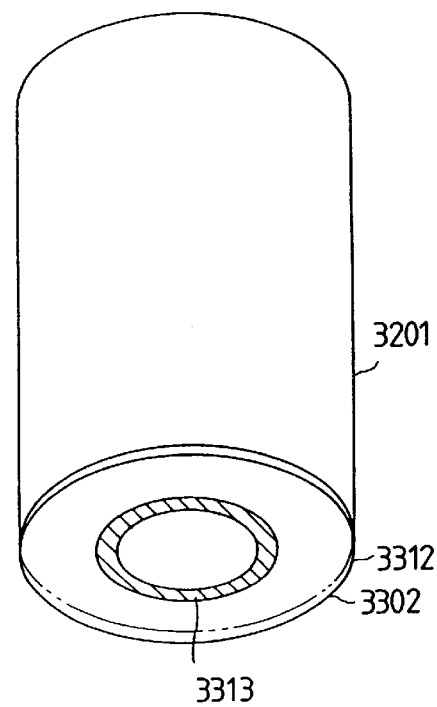
FIG. 31 is a perspective view showing another embodiment of an imaging lens having an imaging spatial filter in an exposure system according to the present invention.

FIG. 11 is a perspective view of the imaging lens 3201 in which the imaging spatial filter 3302 is arranged at the position 3204. In this case, the imaging spatial filter 3302 is formed from a metal plate and therefore supported by support rods 3311. Needless to say, the smaller in number and smaller in diameter of the support rods 3311, the better. FIG. 31 shows an embodiment of the imaging spatial filter 3302 formed in front of or at the rear of the imaging lens 3201 by forming a shield film 3313 on a glass substrate 3312. In this case, the support rod is not necessary but the imaging lens 3201 need be designed in consideration of aberration caused by the glass substrate 3312.

Let M be the imaging magnification between the light source spatial filter 3301 and the imaging spatial filter 3302, the relationship between DLO which is an outside diameter of the light source spatial filter 3301, DLI which is an inside diameter of the light source spatial filter 3301, DIO which is an outside diameter of the imaging spatial filter 3302 and DII which is an inside diameter of the imaging spatial filter 3302 as shown in FIG. 32 will be described later. In short, if a part or the whole of the O-order diffraction light is shielded, a fine circuit pattern on a mask can be imaged on a wafer with high contrast.

As described above, with respect to DIO and DII of the imaging spatial filter 3302 as well as DLO and DLI of the light source spatial filter 3301, a variable spatial filter such as a liquid crystal display element is constituted or a plurality of spatial filters which are different in dimension from one another are exchangeably provided whereby the ring-like dimension of the spatial filters can be controlled.

One embodiment of the entirety of a projection exposure system according to the present invention will be described hereinafter with reference to FIGS. 27 to 36.

Figure 27:
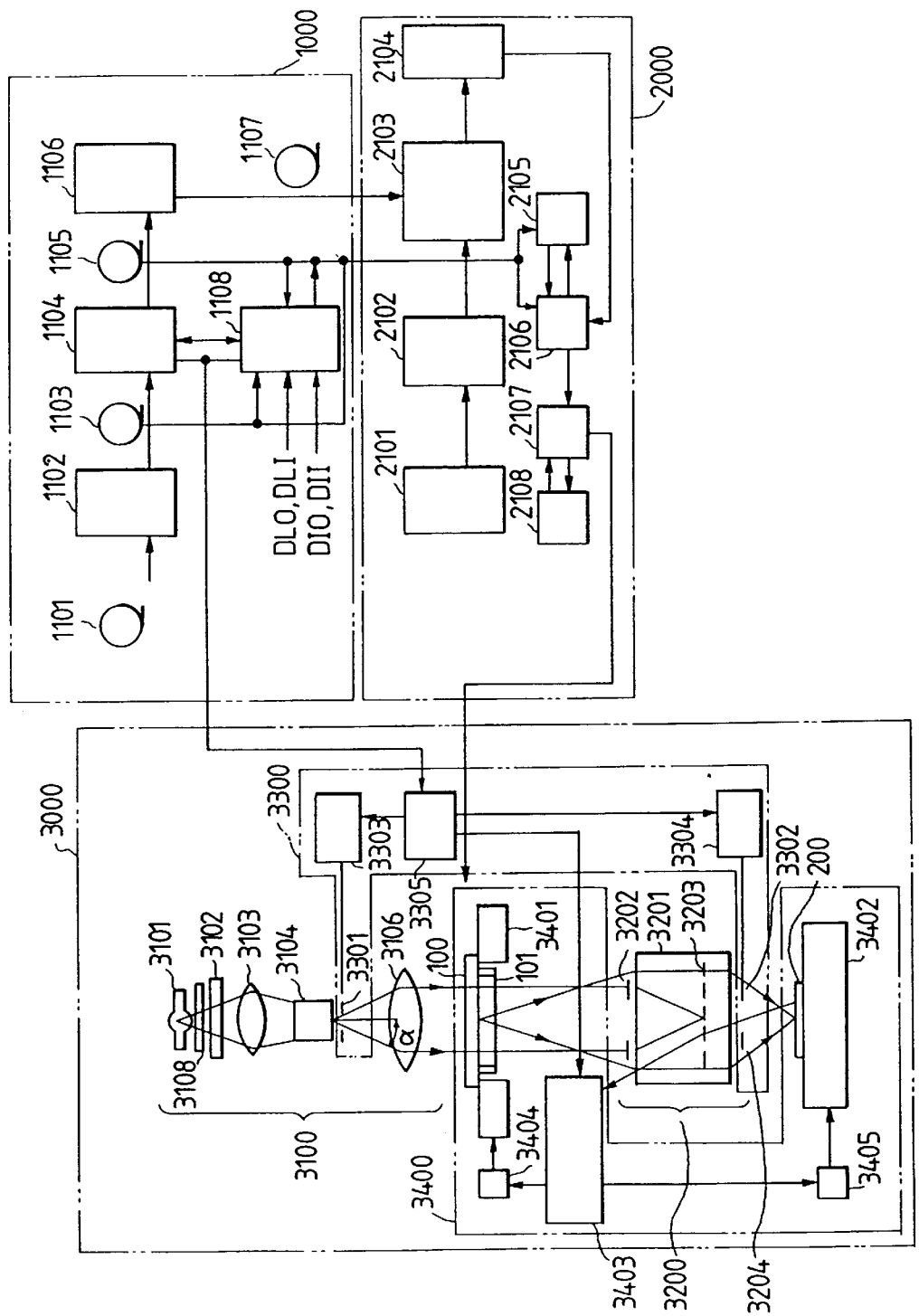
FIG. 27 is a structural view showing one embodiment of the whole exposure system according to the present invention.

First, a pattern data producing system 1000 as shown in FIG. 27 will be described. In the pattern data producing system 1000 and in a wiring data preparing portion 1102, wafer pattern shape data 1103 desirably formed on a substrate (wafer) 200 is formed on the basis of a wiring drawing data 1101 such as design data. A pattern conversion portion 1104 converts a mask pattern shape data 1105 desirably formed on a mask (reticle) 100 on the basis of the wafer pattern shape data 1103. At that time, a pattern transfer simulator 1108 checks whether or not a mask pattern on the mask converted by the pattern conversion portion 1104 approximately coincides with the wafer pattern shape data 1103 when actually exposed on the substrate 200 by a pattern transfer optical system on the basis of the wafer pattern shape data 1103 formed by the wiring data preparation portion, the setting conditions such as the outside diameter DLO, the inside diameter DII or the like of a ring portion 3305 of a light source spatial filter 3301 and the setting conditions of the outside diameter DIO, the inside diameter DLI or the like of a ring portion 3306 of an imaging spatial filter 3302. The mask pattern is then fed back to the pattern conversion portion 1104 for correction to obtain an optimum shape (such as the outside diameter DLO, the inside diameter DLI or the like of the ring portion 3305, and the outside diameter DIO, the inside diameter DII or the like of the ring portion 3306) of the spatial filter adjusted to the wafer pattern shape data 1103, results of which are sent to a light source spatial filter control portion (an adjusting portion) 3303 and an imaging spatial filter control portion (adjusting portion) 3304 through a spatial filter control system 3305 to control (adjust) the shape of the light source spatial filter 3301 and imaging spatial filter 3302. The pattern producing portion 1106 converts an EB data 1107 suited to an electron beam depicting device 2103 on the basis of the mask pattern shape data 1105 converted by the pattern conversion portion 1104.

Figure 39A:
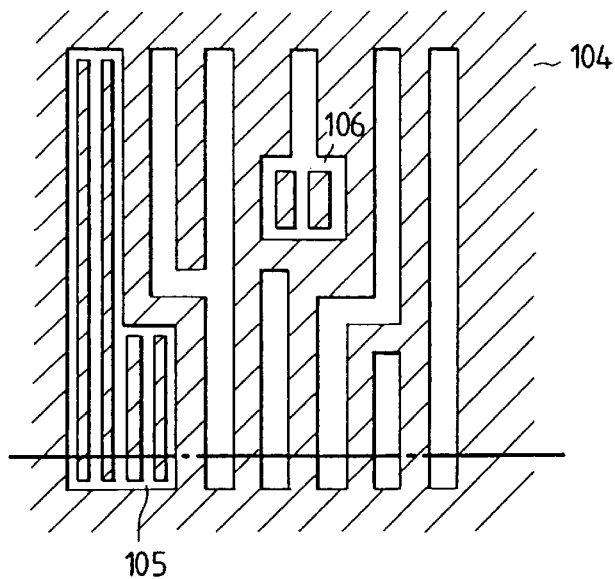
FIGS. 39(a) and (b) is a plan view and a sectional view of one example of a mask pattern for obtaining the wafer pattern shown in FIG. 37 according to the present invention.
Figure 39B:
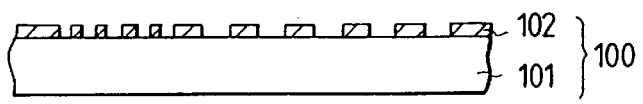

Next, a mask fabrication system 2000 will be described. A film forming device 2101 forms a plurality of stacked films 202 formed of metal chrome or chrome oxide or metal chrome and chrome oxide on a mask substrate 101. A coating device 2101 coats a resist film 203 on the mask substrate 101 formed by the film forming device 2101. The electron beam depicting device 2103 depicts and forms the same circuit pattern as the mask pattern shape 1105 in accordance with the EB data 1107 produced from the pattern producing portion 106. Thereafter, a circuit pattern on the mask substrate 201 is developed by a developing device 2104 to complete a mask 100. The completed mask 100 is inspected in pattern by comparing image data detected by a pattern inspection device 2106 with mask pattern data 1103 or wafer pattern data 1105 or data from the transfer simulator 1108. If a defect is present, it is corrected by a pattern correction device 2105 composed of an ion beam machine or the like, and finally, a foreign particle on the mask 100 is inspected by a foreign particle inspection device 2107. If a foreign particle is present, it is washed by a washing device 2108. The mask 100 according to the present invention is characterized in that it is easily washed as compared with a mask of a phase shifter since the mask can be formed of a single layer film 102 as shown in FIG. 39, for example. Furthermore, the mask 100 can be easily manufactured as compared with a mask of the phase shifter. In the pattern inspection device 2105, the detected image data may be compared with any of the mask pattern data 1103 or the wafer pattern data 1105 or data from the transfer simulator 1108. However, most effectively, the light source of the pattern inspection device 2105 and the forming optical system is made equivalent to a pattern transfer system (reduction projection exposure system) 3000 according to the present invention to compare it with the wafer pattern data 1105. More specifically, the pattern inspection device 2105 is composed of an optical system equivalent to the pattern transfer system (reduction projection exposure system) 3000, and a mask 100 to be inspected is placed on a mask stage 3401 and a light receiving element is arranged at a position in which a wafer (substrate) 200 is placed so as to detect an image to be imaged on the light receiving element. With the pattern inspection device 2105 designed as described above, the same circuit pattern as an extremely fine circuit pattern actually projected and exposed to the wafer (an extremely fine circuit pattern of 1 μm or less on a wafer) can be detected as an image signal with high contrast from the light receiving element without being effected by interference of light, and as the result, it is compared with the wafer pattern data 1105 whereby even a fine circuit pattern can be inspected accurately.

Figure 28:
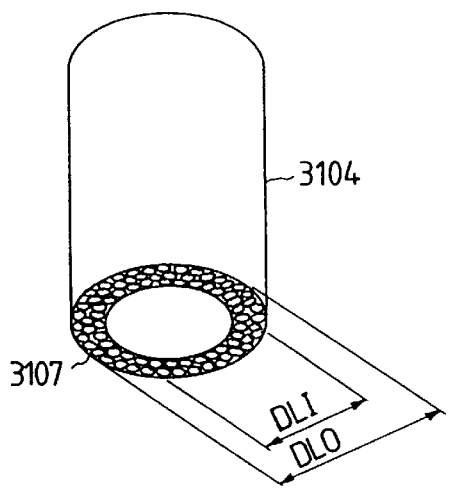
FIG. 28 is a perspective view showing an integrator having an light source spatial filter in an exposure system according to the present invention.
Figure 29:
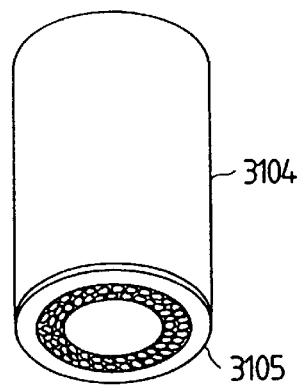
FIG. 29 is a perspective view showing another embodiment of an integrator having a light source spatial filter in an exposure system according to the present invention.
Figure 30:
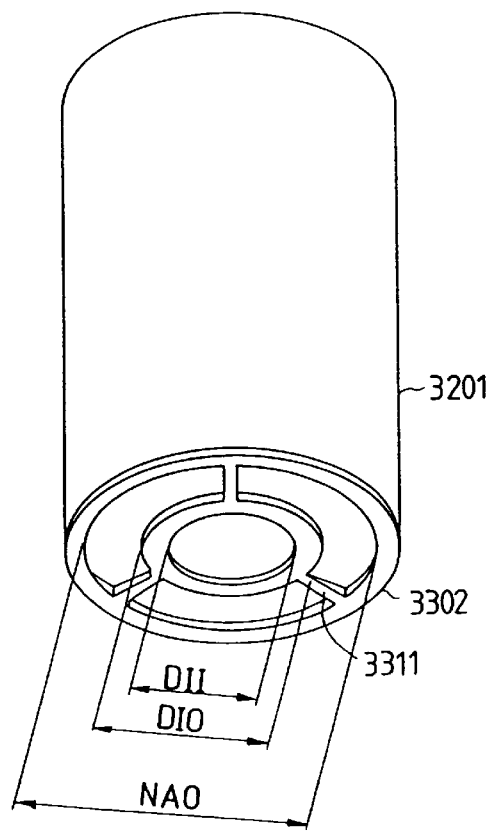
FIG. 30 is a perspective view showing an embodiment of an imaging lens having an imaging spatial filter in an exposure system according to the present invention.

Next, a pattern transfer system (reduction projection exposure optical system) 3000 of the present invention will be described hereinafter. In the pattern transfer system 3000, an i-ray having a wavelength of 365 nm out of light from a Hg lamp 3101 is selectively transmitted by a color filter 3102 and condensed on the surface of an integrator 3104 by a condenser lens 3103. Light incident on elements 3107 (FIG. 28) in the integrator 3104 individually exit at an angle of exit to illuminate the upper portion of the mask 100 by a condenser lens 3106. FIGS. 28 and 29 show different modes of the integrator 3104. FIG. 28 shows the case where a section of the integrator 3104 is in the form of a ring. FIG. 29 shows an embodiment of the integrator 3104 in which a ring-like shape is formed by a shield plate 3105. In short, it is obvious that other configurations may be employed as long as one performs a role of a spatial filter, that is, a ring has a shield function. Preferably, the DLI and DLO of the light source spatial filter 3301 configured as described above can be controlled by the provision of a plurality of spatial filters different in dimension from one another so that they are exchanged whereby they can be controlled or adjusted by a command from a light source spatial filter control portion (adjusting portion) 3303. Otherwise, a freedom is greatly restricted.

In the present invention, when a shield plate is placed on a light source surface, a synthetic light quantity is reduced. Accordingly, it is necessary to increase the light intensity of the light source. In a conventional lamp, it has been difficult to increase the light intensity. The strobe light source for fiber illumination is disclosed in "Development and Research of Strobe Light Source for Fiber Illumination" written by Yamamoto, Lecture Meeting of Society of Applied Physics, 1991, 11p-ZH-8-. The strobe light source as disclosed therein has not been used for an exposure apparatus. However, it is effective for the present invention which requires to sufficiently obtain the light intensity to use a lamp as described. This light source is suited to the present invention because it has a larger diameter.

In the embodiment shown in FIG. 23, an integrator using an optical fiber as shown in FIG. 25 is effective. The integrator using an optical fiber comprises a bundle of a number of optical fibers 380. A light introducing surface 3131 is circular in shape so as to easily condense light from a light source 3101, and a light emitting surface comprises a bundle of optical fibers so as to be a ring-like configuration. By using the optical fibers, a light source having a circular light source shape such as a mercury lamp can be used to efficiently prepare a ring-like light source. An integrator 3104 can be prepared to be flexible by using the optical fibers. This brings fourth an effect in that a light source as a hearing source can be installed at a position away from the apparatus body which requires temperature control.

It is suggested that a bundle of fibers shown in FIG. 25 is scattered so that the outer and inner diameters can be varied. Such a variable mechanism is controlled by a light source spatial filter control mechanism 3303.

Light having transmitted through a mask pattern 104 (FIG. 34) on a mask 100 and diffracted is imaged as a wafer pattern 204 (shown, for example, in FIG. 37) on a wafer 200 through an imaging lens 3201 and an imaging spatial filter 3302.

The imaging spatial filter 3302 may be at a position 3202 in front of the imaging lens 3201 or at a position 3204 at the rear of the imaging lens or at a position 3203 of a pupil in the imaging lens.

An image of the light source spatial filter 3301 is imaged at a position of the imaging spatial filter 3302 by the condenser lens 3106 and the imaging lens 3201. FIGS. 32 and 33 show the imaging relationship between the light source spatial filter 3301 and the imaging spatial filter 3302 in the present embodiment. The light source spatial filter as well as the imaging spatial filter have a shape of a ring. The light source spatial filter 3301 has a ring portion 3305 having the outside diameter DLO and the inside diameter DLI, and both the inside and outside of the ring portion 3305 are shielded. In the imaging spatial filter 3302, the ring portion 3306 having the outside diameter DIO and inside diameter DII is shielded, and it is designed so that light transmits through both the inside and outside of the ring portion 3306. Let M be the imaging magnification between the light source spatial filter 3301 and the imaging spatial filter 3302, the relationship of the following expression (6) is established between DLO, DLI, DIO and DII:

$$DIO = M \cdot \delta \cdot DLO$$

$$DII = M \cdot \epsilon \cdot DLI$$

$$MDLI \leq DII \leq DIO \leq M \cdot DLO \quad (6)$$

wherein d and d are the coefficients, which are fulfilled with the following expression (7):

$$0.7 \leq \delta \leq 1.0$$

$$1.0 \leq \epsilon \leq 1.3 \quad (7)$$

When these coefficients are fulfilled with the above-described expression (7), the effect of the present invention is most conspicuous. However, these expressions need not always be satisfied but a part or the whole of the O-order diffraction light may be shielded. In setting δ and ε, values of δ and ε of the spatial filter with highest contrast are selected by the pattern transfer simulator 1108.

Figure 42A:
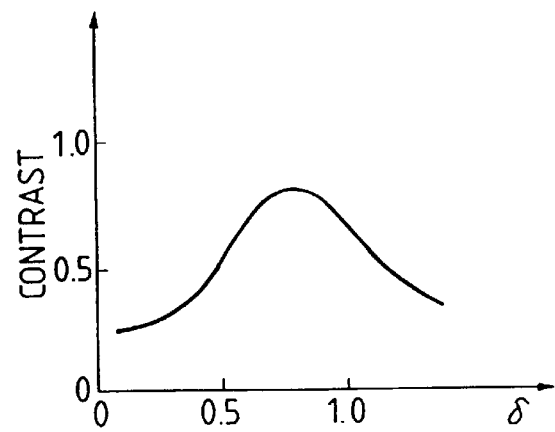
FIGS. 42(a) and (b) show a view showing a relationship contrast on a wafer and $\check{S}$, $\check{Y}$ filter according to the present invention.
Figure 42B:
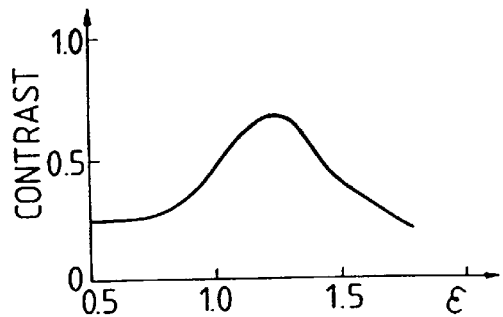

FIG. 42 shows the contrast when the values of δ and ε are changed. In this figure, when δ is 0.8 and ε is 1.1, the best contrast is obtained. However, it is apparent from FIG. 3 that the best contrast is not obtained only at the time of the aforesaid values.

Let NAO be the number of openings of the imaging lens (reduction projection optical system) 3200 on the exit side 3204, and NAL be the number of openings of one in which a light source image is projected at the same position 3204. The NAL/NAO is defined as a spatial coherence degree σ.

Figure 43:
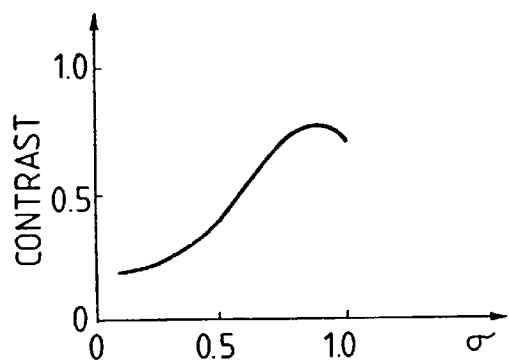
FIG. 43 shows a relationship between contrast on a wafer and $\acute{I}$ in connection with a spatial filter according to the present invention.

FIG. 43 shows the relationship between σ and the contrast. When σ is about 0.9, the best contrast is obtained. However, even if σ is somewhat deviated from 0.9, high contrast is obtained.

The object of the present invention is achieved most conspicuously in the case where a light source spatial filter 3301 and an imaging spatial filter 3302 shown in FIG. 13 are used. However, since the object of the present invention is achieved by shielding a part of the entirety of the O-order diffraction light, even if an air filter shown in FIGS. 14 to 17 is used, a circuit pattern with high contrast can be imaged on a wafer. In the air filter shown in FIGS. 14 to 17, an oblique line shown therein comprises a shield portion. A pattern transfer system 3000 comprises a light source portion 3100 comprising a Hg lamp 3101, a color filter 3102, a condenser lens 3103, an integrator 3104 and a condenser lens 3106; an imaging optical system 3200 comprising an imaging lens 3201; a spatial filter control system (a regulating system) 3300 comprising an entirety control portion 3305 for delivering control signals to a light source spatial filter control portion (regulating portion) 3303, an imaging spatial filter control portion (regulating portion) 3304 and a locating mark detection portion 3403 on the basis of command signals such as DLO, DLI, DIO, DII, etc. obtained from a light source spatial filter control portion (regulating portion) 3303 for controlling a light source spatial filter 3301, an imaging spatial filter 3302 and a light source spatial filter 3301, an imaging spatial filter control portion (regulating portion) for controlling an imaging spatial filter 3302 and a pattern transfer simulator 1108 to control the entirety; and a locating portion 3400 comprising a mask stage 3401 placing thereon a mask 100, a wafer stage 3402 placing thereon a wafer 200, a locating mark detection portion 3403 for detecting a locating mark on the wafer, a mask stage control system 3404 for controlling a mask stage 3304 in accordance with a command from the locating mark detection portion 3403 and a wafer stage control system 3405 for controlling the wafer stage 3402 in accordance with a command from the locating mark detection portion 3403.

With the above-described arrangement, the operation is as follows: A mask 100 fabricated by a mask fabrication system 2000 is placed on the mask stage 3401 and illuminated by the light source portion 3100. A part of the O-order diffraction light having transmitted from the mask and from the light source spatial filter 3301 in the light source portion 3100 is shielded by the imaging spatial filter 3302, and high order diffraction light and part of the O-order diffraction light pass through the imaging optical system (reduction projection lens) 3200 to form a circuit pattern on the wafer 200.

A ring-like spatial filter as shown in FIG. 32 is used as the spatial filter because a coherence is provided on the light source. The coherence has two types, one for time, and the other for space. The time coherence is a wavelength band of the light source, the shorter band of light, the higher the coherence. The spatial coherence is the magnitude of the light source, which corresponds to the magnitude of the light source spatial filter 3301. However, when the magnitude of the light source is made small in order to increase the coherence, the light intensity of the light source becomes small and the exposure time becomes extended, as a consequence of which through-put of the exposure falls. When the ring-like light source spatial filter 3301 is used, an image of the light source spatial filter 3301 formed at the imaging position is the O-order diffraction light. That is, the use of the ring-like spatial filter 3301 can realize a light source which is high in intensity and has a coherence. This is the same art as that uses a ring-like spatial filter to obtain a coherent light from a white light in a phase difference microscope, which is disclosed in "Wave Optics" (Iwanami Shoten) written by Kubota.

There is a further reason why the light source spatial filter 3301 has a ring-like shape. As previously explained, there is a relationship, as shown, between a dimension of a pattern on a wafer desired to be transferred and a spatial coherence degree of a light source by which a pattern with that dimension is transferred with highest contrast. Thus, when the space coherence degree adjusted to a dimension (pitch) of a pattern desired to be transferred, the effect of the present invention conspicuously appears. If the light source spatial filter 3301 and the imaging spatial filter 3302 are formed on the ring, the spatial coherence degree, i.e., the size of the ring is easily controlled.

However, needless to say, the ring radius (spatial coherence degree) of the ring-like light source and space filter is made as large as possible to enhance the resolution.

Figure 36:
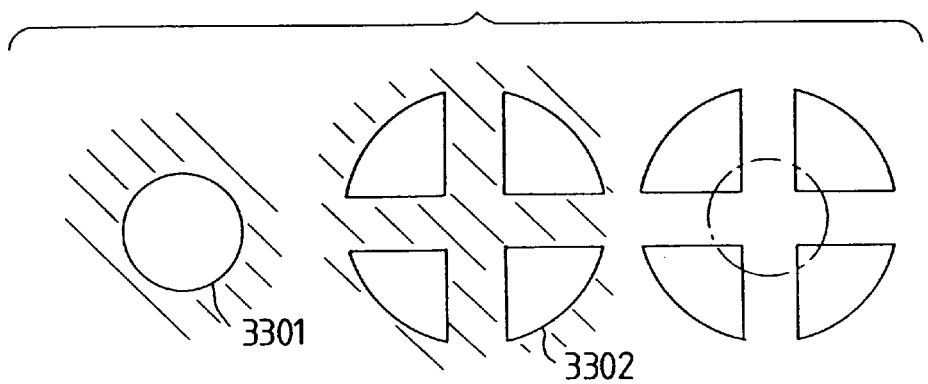
FIG. 36 is a plan view showing a relationship between a light source spatial filter of yet another embodiment and an imaging spatial filter of yet another embodiment according to the present invention.

In the present invention, the ring-like light source as well as the space filter are of a concentric circle. By the provision of a concentric circle, a directivity with respect to a circuit pattern to be transferred by MTF cannot be provided. In transferring an LSI circuit pattern having circuit patterns of various directions, it is important that MTF has no directivity. The concentric filter has an effect that complicated aberrations are hard to enter a lens as compared with a non-concentric filter as shown in FIG. 36.

Since the aforesaid effect can be achieved if the intensities of the 0-order diffraction light and the high order diffraction light are balanced, the effect though somewhat low can be achieved even when the imaging spatial filter 3302 is omitted and only the light source filter 3301 is provided. Conversely, even the light source spatial filter 3301 is omitted and only the imaging spatial filter 3302 is provided, the aforesaid effect though somewhat low can be achieved.

Next, a method for forming a pattern will be described in more detail with reference to FIGS. 37 to 41. As described above, the object of the present invention can be achieved by using the light source spatial filter 3301 and the imaging spatial filter 3302 but the effect of the present invention can be further enhanced by devising a mask pattern 104 as will be described below.

Figure 45:
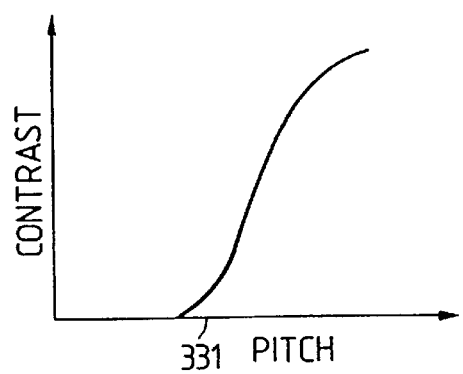
FIG. 45 shows a relationship between a pitch of a circuit pattern on a mask and contrast on a wafer according to the present invention.
Figure 44:
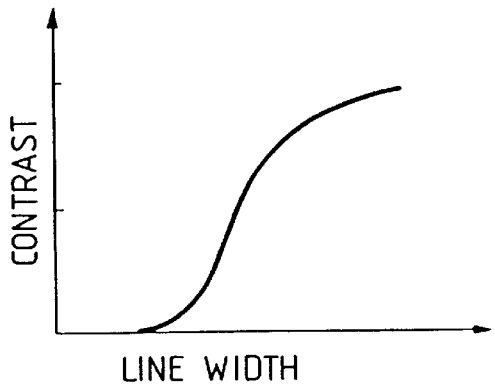
FIG. 44 is a view showing a relationship between a line width of a circuit pattern on a mask and contrast on a wafer according to the present invention.

FIG. 45 shows an imaging optical system 3200 with a line width (light transmission) of a line spatial pattern having the same pitch formed on a mask 100 changed and a contrast of a circuit pattern projected on a wafer 200. As shown in FIG. 44, contrast becomes large as the line width becomes small. That is, the line width is suggested to make small. When the line width is made small, the light intensity is small, and therefore, it is necessary to extend the exposure time. The line width of the circuit pattern formed on the mask 100 is determined in consideration of the contrast and exposure time required to transfer a circuit pattern.

Accordingly, preferably, in the exposure method according to the present invention, the line width for forming the mask pattern 104 is made constant. For this reason, in the case where a wide wafer pattern 204 is desired to be formed, a device is required. In the case where the line width is not constant but wide, the light intensity at the imaging surface is high with respect to a pattern in which a peripheral line width is constant, and a shape of a transferred pattern after resist development is far apart from a circuit pattern to be obtained originally. In the case where there is partly a circuit pattern whose light intensity is high, this results from light which comes therefrom.

To properly form a wide circuit pattern, it is necessary to form the light intensity with the same light intensity as the circuit pattern whose peripheral line width is constant. The method for forming a wide circuit pattern will be described with reference to the figure. When a circuit pattern is transferred by use of the imaging optical system 3200, a circuit pattern which is sufficiently small than a resolving power of the imaging optical system cannot be resolved but imaged evenly. In imaging the aforesaid wide circuit pattern, this phenomenon is utilized. That is, when a fine pattern less than a resolving power of the present optical system is formed on a mask 100 as indicated at 105, 106 and 108 in FIGS. 39 and 40, a wide circuit pattern can be transferred to a wafer 200 as shown in FIGS. 37 and 38.

FIG. 45 shows a contrast when the pitch of a line space pattern changed. As shown in FIG. 45, as the pitch becomes small, the contrast becomes small. That is, when the pitch is made small, there is a position 331 at which the contrast is approximately 0. In the case where the whole surface of the wide circuit pattern is desired to be white, a pattern having the pitch at that position 331 may be used. More specifically, most preferably, there is used a pattern having a pitch approximately ½ of a pitch of a pattern to be resolved. At this pitch, the light intensity of the wide circuit pattern is about the same as that of the minimum pattern.

Figure 37A:
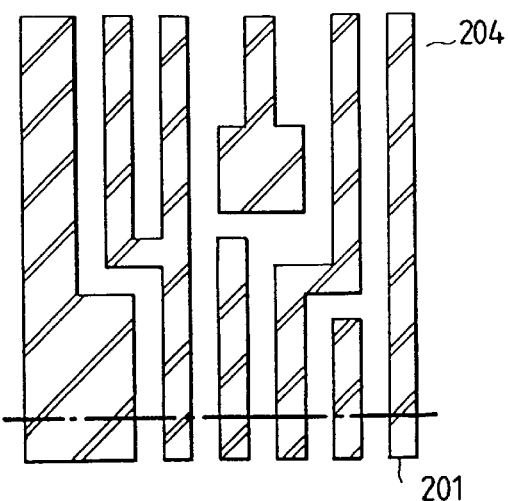
FIGS. 37(a) and (b) show a plan view and a sectional view of one example of a wafer pattern transferred on a wafer.
Figure 37B:
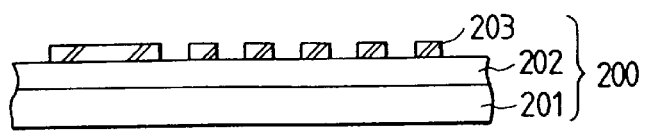
Figure 38A:
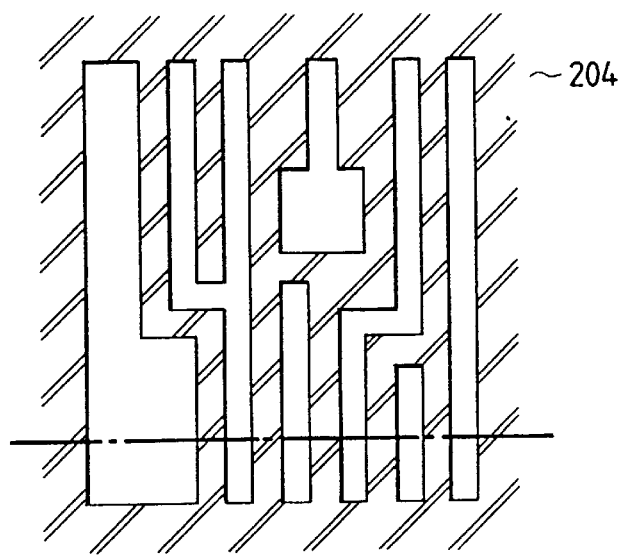
FIGS. 38(a) and (b) show a plan view and a sectional view of a modified wafer pattern transferred onto a wafer according to the present invention.
Figure 38B:
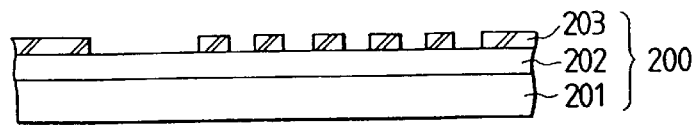
Figures 41A, 41B, 41C:
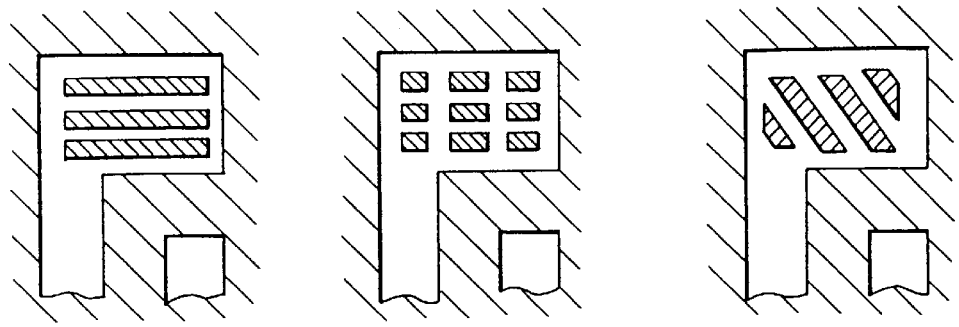
FIGS. 41(a)–(d) show various modes of mask patterns according to the present invention.
Figure 41D:
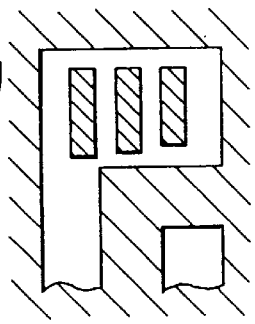

More specifically, in the case where a wafer pattern 204 as shown in FIG. 37 is to be obtained, a mask pattern as shown in FIG. 39 is fabricated, and a negative resist is used, or a mask pattern as shown in FIG. 40 is fabricated and a positive resist is used. In this case, patterns 105, 106, 107 and 108 desired to transmit light therethrough are formed by patterns having a small pitch as shown in FIG. 41. A mask pattern 104 in the case where light is transmitted over a wide range as in these patterns 105, 106, 107 and 108 is automatically produced by a pattern conversion portion 1104 and is simulated by a pattern transfer simulator 1108 as needed.

A pattern of ½ pitch may be ½ pitch in only one of X-direction and Y-direction. Needless to say, of course, a grating pattern which has ½ pitch in both X- and Y directions is employed. The pitch need not always be ½ but other pitches may be employed at which the light intensity on the wafer pattern 204 is sufficient as needed.

Even in the case of a mask in which an extremely fine circuit pattern and a large circuit pattern are mixed, the transfer can be made by one reduction projection exposure by the aforementioned method. However, in the case where an extremely fine circuit pattern and a large circuit pattern are transferred by more than twice reduction projection exposure, the aforementioned method need not be employed but a pattern 104 can be formed merely by a pattern whose line width is constant. In this case, there is an effect in that a system such as the pattern conversion portion 1104 is not necessary.

As described above, the method of the present invention has an effect in that since a phase shifter need not be arranged, processing by the pattern conversion portion 1104 is simple, and time can be saved and an error can be reduced.

While in the present embodiment, a mask pattern has been converted with a circuit pattern having a constant line width as a base, it is to be noted that in a circuit pattern which involves many repetitive portions such as memory, a mask pattern 104 so as to obtain an optimum wafer pattern 204 while being simulated by a transfer simulator 1108 can be obtained. Namely, the mask pattern 104 is obtained by the transfer simulator 1108 for every memory cell.

A transfer mechanism on a wafer of a mask pattern will be described referring again to FIGS. 1, 2 and 3 wherein FIG. 1(a) is a sectional view of a mask 100 in which a mask pattern 104 is formed of chrome 102 on a glass substrate 101. A waveform 301 shown in FIG. 1(b) is a strong signal degree distribution of an imaging pattern of a mask pattern 104. The waveform 301 may be divided into a waveform 302 by the O-order diffraction light and a waveform 303 by high order diffraction light. In the case where the mask pattern 104 is a fine pattern 105 as shown, the waveform 303 by the high order diffraction light is small with respect to the waveform 302 by the O-order diffraction light, and therefore, the waveform 301 to be detected is small in contrast AM/AV. Since a component of the waveform 302 is removed by shielding the O-order diffraction light, the detected waveform is high in contrast as in the waveform 302.

According to the Babinet principle, in diffraction patterns other than the O-order diffraction light, light from patterns adjacent to each other is viewed as if phases of patterns adjacent to each other are inverted (deviated by $\pi$). That is, if the O-order diffraction light is shielded on the diffraction pattern, light to be imaged on the wafer surface is equivalent to one in which light from patterns adjacent to each other in which as if phases are inverted (deviated by $\pi$) is imaged. At least a part of the O-order diffraction light is shielded by a shield plate 324 (an imaging spatial filter 3302) at a diffraction image surface as shown in FIGS. 2 and 3 on the basis of the aforesaid technique, whereby only the diffraction light inverted in phase as shown in FIGS. 2 and 3 reaches the imaging surface, and therefore, the strength distribution of the imaging surface is high in contrast.

Figure 46:
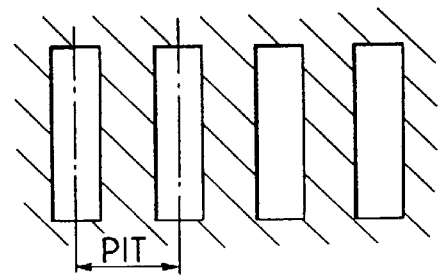
FIG. 46 is a plan view showing one example of a circuit pattern on a mask according to the present invention.
Figure 47:
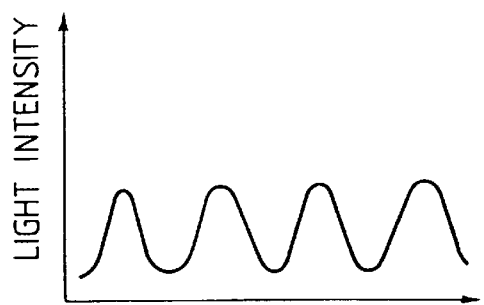
FIG. 47 shows a transfer result of a circuit pattern of FIG. 46 according to the present invention.
Figure 48:
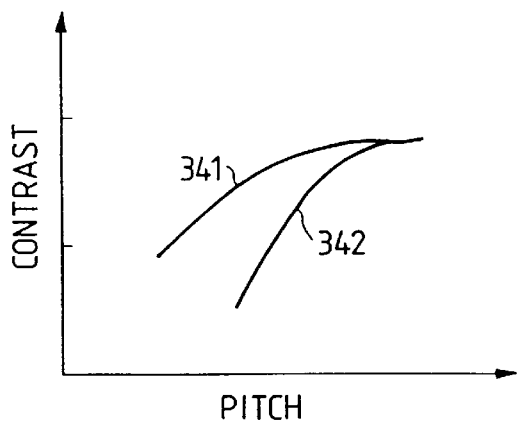
FIG. 48 shows a relationship between a pitch of an extremely fine circuit pattern formed on a mask and contrast on a wafer according to the present invention.

A mechanism for enhancing a contrast will now be described. As an example, FIG. 47 shows the transfer result of a circuit pattern formed on a mask shown in FIG. 46, and FIG. 48 shows a change in contrast when a pitch PIT, as shown in FIG. 46, is changed. In the conventional reduction projection exposure method, a contrast rapidly goes down as a pattern size becomes finer as indicated by curve 342, while in the reduction projection exposure method according to the present invention, it is understood that a contrast does not go down, as shown by curve 341.

Figure 49:
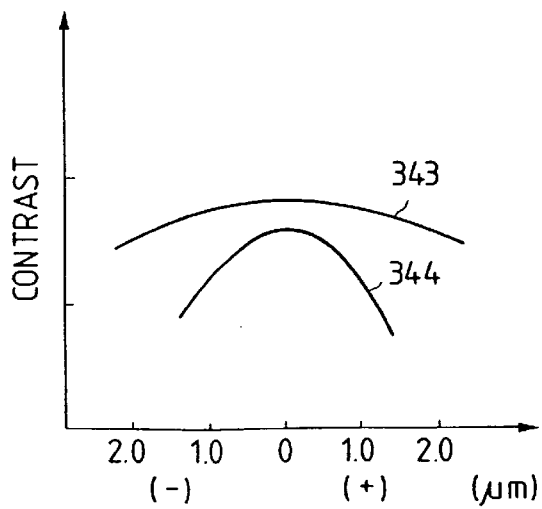

FIG. 49 shows an evaluation example of the focal depth in the reduction projection exposure method according to the present invention. According to the present invention, contrast indicates a value over about 80% in the range of ±1.5 $\mu$m as indicated by curve 343. In the conventional reduction projection exposure method, contrast rapidly drops due to a deviation of focal point as indicated by curve 344. This indicates that it can correspond to a resist whose film is thick according to the present invention, and as a result, a wafer pattern with a resist at a high aspect ratio can be formed. As the result, a pattern with a resist well retained at etching and with a high aspect ratio can be formed.

Figure 14:
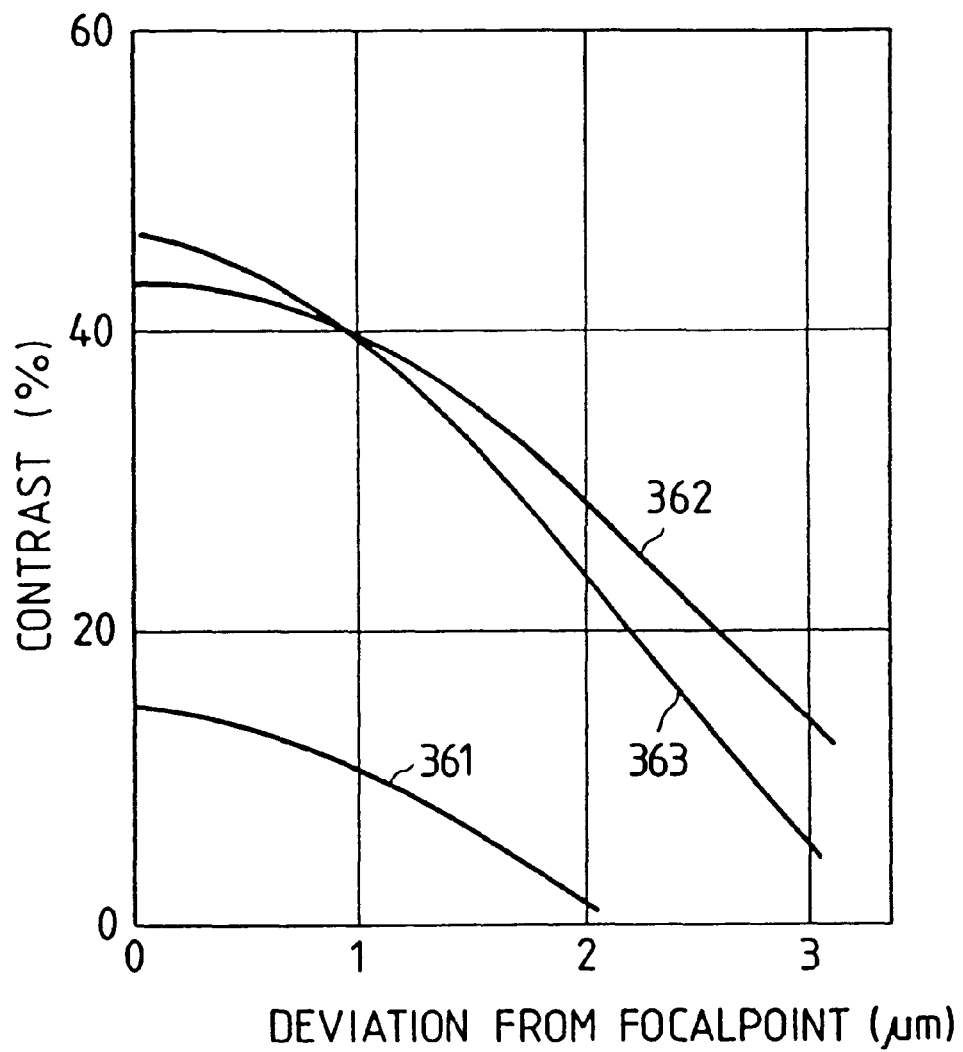
FIG. 14 is a view showing the focal depth according to the present invention.

FIG. 14 shows a focal depth 362 of the present invention and a focal depth 363 of the phase shifter method. Both the focal depths are substantially coincided. The focal depth 362 of the present invention shows the excellent result as compared with the focal depth 361 of prior art.

FIG. 50 shows an embodiment of an excimer stepper which uses, as a light source, an excimer laser shorter in wavelength than the i-ray. According to this embodiment, an excimer laser beam in the shape of a ring is scanned at a position of a light source spatial filter 3301 so that the effect of the light source spatial filter 3301 can be achieved. Furthermore, according to this embodiment, the shape of the light source spatial filter 3301 can be easily controlled by controlling a scanning portion. That is, in this embodiment, as the light source portion 3100 in the embodiment shown in FIG. 27, there is used an excimer laser which uses gas such as KrF (krypton fluoride) having a shorter wavelength. A further fine circuit pattern can be transferred by using light having a shorter wavelength. Needless to say, in this embodiment, a laser having other wavelengths can be used. In this embodiment, the light source portion 3100 comprises an excimer laser 3111, a shutter 3108, a beam expander 3112, an X galvanomirror 3113, a Y galvanomirror 3114, an integrator 3104, an integrator cooling arrangement 3120 and a condenser lens 3106. The spatial filter portion 3300 comprises a scan control system 3311, a liquid crystal display element 3312 and a liquid crystal control system 3313, and the light source filter regulating system 3303 in the embodiment shown in FIG. 27 corresponds to the X galvanomirror 3113, the Y galvanomirror 3114 and the scan control system 3311. The integrator cooling arrangement is adapted to prevent an increase in temperature of the integrator 3104 due to excimer laser light concentrated to the integrator. It is noted that the cooling arrangement 3120 may be of a type to circulate cooling water or to spray nitrogen gas for cooling. Other constituent elements correspond to those shown in FIG. 27. That is, in this embodiment, the position of the light source spatial filter 3301 is the position of the integrator 3104, and the X galvanomirror 3113 and the Y galvanomirror 3114 in the light source spatial filter regulating portion 3303 are scanned to thereby form a ring-like light source having the same shape as that of the light source spatial filter 3301. In the imaging spatial filter 3302, a shield portion is formed on the liquid crystal display element 3312 by the liquid crystal control system 3313 so as to have a shape which shields a part or the entirety of the O-order diffraction light as described in the embodiment shown in FIG. 27. Accordingly, it is necessary that the resolving power of the liquid crystal display element 3303 has sufficient accuracy to form the above-described ring-like shape. In addition, an imaging spatial filter will suffice to be formed, and instead of the liquid crystal display element, other elements, for example, a metal plate formed so as to shield in a ring-like fashion or one in which a ring-like shield film is formed on glass may also be employed.

Furthermore, an excimer laser beam is condensed at one point on the imaging spatial filter 3302. A ring-like shape is obtained on the imaging spatial filter first by the scanning on the light source spatial filter in a ring-like fashion. If only respective points on the imaging spatial filter as well as the scanning on the light source spatial filter are shielded, the object of the present invention can be achieved. Thereby, light is not excessively shielded, and there provides effects that exposure time can be shortened, and the through-put can be increased. The mask 100 is placed on the mask stage 3401, the mask stage 3401 is controlled by the mask stage control system 3404, the mask 100 is located to a reference position, a position of an alignment mark on the wafer 200 is then detected by the locating mask detection portion 3403, the wafer stage 3402 is controlled by the wafer stage control system 3405 in accordance with the detected signal, and the mask 100 and the wafer 200 are adjusted in position. After the adjustment of position, the shutter 3108 is opened, and a ring-like light source is formed by the light source spatial filter regulating portion 3303 so that the mask 100 is illuminated and a mask pattern is transferred onto the wafer 200 to form a wafer pattern.

In this embodiment, since the light from the excimer laser 3111 has a high coherence, this coherence need be decreased to an adequate value. A ring-like light source can be formed on the light source spatial filter 3301 to thereby achieve the object simultaneously.

Particularly, in the present invention, it will suffice that uniform illumination can be made within an exposure field (within an exposure area). The ring-like illumination in which a number of imaginary point sources are arranged need not necessarily be illuminated simultaneously, but even if it is divided in time into plural numbers, scanning may be employed as in the previous embodiment. It is also apparent that the ring-like illumination in which a number of point sources are arranged may be divided into plural sections.

As described above, in the present invention, a large circuit pattern portion and a small circuit pattern portion can be exposed twice. Further, a mask with a phase shifter arranged can be used on at least a part (or whole) of the circuit pattern on the mask. In this case, a ring-like light source is used so that a center value of an incidence angle of illuminating light incident upon a reticle is large, and therefore, it is necessary to make a thickness of a phase shifter somewhat thin in order that a deviation of phase caused by the phase shifter is p. This value is calculated using an incidence angle according to expression (8).

$$(2m+1)\pi \leq (d/\cos\theta)\cdot(n/\lambda)\cdot 2\pi \tag{8}$$

wherein m represents an integer, d represents a thickness of a phase shifter, n represents a refractive index of the phase shifter, and $\lambda$ represents an exposure wavelength.

As described above, the present invention brings forth a new effect such that it can correspond to various circuit patterns by a conventional exposure apparatus or a combination of a phase shifter and the like.

In carrying out the present invention, since the incidence angle of light illuminated on the reticle is large, a problem arises in a thickness of a circuit pattern such as chrome on the mask. Accordingly, it is desired that in carrying out the present invention, a thickness of a circuit pattern such as chrome on the mask is made thin in order to obtain an accurate dimension of a transferred pattern. Accordingly, the following expression (9) is required to be fulfilled.

$$dm = pc/1 \tag{9}$$

wherein dm represents a thickness of a circuit pattern such as chrome, pc represents an allowance value of a transferred pattern, and 1 represent a reduction rate of a reduction projection lens.

In order to realize this, it is necessary to perform patterning of a mask with other materials which is lower in transmittance than that of chrome. However, if the dimension of a circuit pattern of a mask is determined taking a variation of dimension caused by the incidence angle of illumination into consideration, the aforesaid problem can be reduced.

Furthermore, when a coating in which the transmittance of luminous flux which is incident upon at a using incidence angle is maximum is applied to the transmission portion of the mask, the exposure quantity increases, enabling to reduce time required for exposure.

It is apparent that since the present invention makes use of the vibration property as mentioned above, it can be applied to an exposure device which uses an electron beam and X-rays.

According to the present invention, unbalance in light intensity between the O-order diffraction light and the diffraction light can be avoided when a mask pattern is transferred. The present invention has the effect that exposure can be made with a resolving power equal to or more than that which uses a phase shifter by a conventional white and black mask pattern.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

What is claimed is:

1. An exposure method comprising the steps of illuminating a pattern on a mask with exposure light and exposing the pattern onto a substrate utilizing a projection system, wherein the step of illuminating the pattern on the mask with the exposure light includes passing the exposure light through a first filter means and a secondary light source producing means so as to illuminate the pattern on the mask, and the step of exposing the pattern onto the substrate includes passing the exposure light after illuminating the pattern on the mask and passing through the mask through a second filter means which is provided at a pupil position of a projection lens of projection optics of the projection system so as to expose the pattern onto the substrate.

2. An exposure method according to claim 1, wherein the substrate is a wafer.

3. A method according to claim 1, wherein the second filter shields at least a part of O-order diffraction light so as to substantially prevent passage of the at least a part of the O-order diffraction light therethrough.

4. A method according to claim 1, wherein the patterned mask includes a phase shifter so as to shift a phase of illuminating light passing through the mask.

5. An exposure method according to claim 1, wherein said exposure light is an excimer laser beam.

6. An exposure method according to claim 5, wherein the first filter means and the secondary light source producing means include an integrator and the second filter means at least forms a part of an imaging lens means.

7. An exposure method comprising the steps of illuminating a pattern on a mask having a phase shifter with exposure light and exposing the pattern onto a wafer, wherein the step of illuminating the pattern on the mask with the exposure light includes passing the exposure light through a filter means and a secondary light source producing means so as to illuminate the pattern on the mask having the phase shifter so as to shift a phase of the illuminating light passing through the phase shifter of the mask, and the step of exposing the pattern on the substrate includes passing the exposure light after illuminating the pattern on the mask having the phase shifter so as to expose the pattern onto the wafer.

8. An exposure method according to claim 7, wherein said exposure light is an excimer laser beam.

9. A production method of a semiconductor device, comprising the steps of illuminating a pattern on a mask with exposure light and exposing the pattern onto a semiconductor device, wherein the step of illuminating the pattern on the mask with the exposure light includes passing the exposure light through a first filter means and a secondary light source producing means so as to illuminate the pattern on the mask, and the step of exposing the pattern onto the semiconductor device includes passing the exposure light after illuminating the pattern on the mask through a second filter means which is provided at a pupil position of a projection lens of projection optics of the projection system so as to expose the pattern onto the semiconductor device.

10. A production method according to claim 9, wherein the exposure light is primarily excimer light.

11. A production method according to claim 9, further comprising the step of selecting the first filter provided in the secondary light source in accordance with a spatial frequency of the pattern of the mask.

12. A production method according to claim 9, wherein the patterned mask includes a phase shifter so as to shift a phase of the illuminating light passing through the mask.

13. An exposure method according to claim 9, wherein said exposure light is an excimer laser beam.

14. A production method of a semiconductor device, comprising the steps of illuminating a pattern on a mask having a phase shifter with exposure light and exposing the pattern onto a semiconductor device, wherein the step of illuminating the pattern on the mask with the exposure light includes passing the exposure light through a filter means and a secondary light source producing means so as to illuminate the pattern on the mask having the phase shifter so as to shift a phase of the illuminating light passing through the patterned mask, and the step of exposing the pattern onto the semiconductor device includes passing the exposure light after illuminating the pattern on the mask having the phase shifter so as to expose the pattern onto the semiconductor device.

15. A production method according to claim 14, wherein the exposed pattern has a line width less than 0.3 $\mu$m.

16. An exposure method according to claim 14, wherein said exposure light is an excimer laser beam.

17. A production method of a semiconductor device, comprising the steps of illuminating a first circuit pattern on a mask having a phase shifter through a projection lens of a first projection exposure system so as to expose the first circuit pattern onto a wafer, and illuminating a second circuit pattern on a mask with the exposure light through a filter means and a secondary light source producing means of a second projection exposure system for exposing the second circuit pattern onto the wafer.

* * * * *